US009538637B2

(12) United States Patent
Zhao et al.

(10) Patent No.: US 9,538,637 B2
(45) Date of Patent: Jan. 3, 2017

(54) MULTICHANNEL RF FEEDTHROUGHS

(75) Inventors: Yan yang Zhao, Fremont, CA (US);
Bernd Huebner, Mountain View, CA (US); Tengda Du, San Jose, CA (US); Yuheng Lee, Fremont, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 558 days.

(21) Appl. No.: 13/533,895

(22) Filed: Jun. 26, 2012

(65) Prior Publication Data
US 2013/0001410 A1   Jan. 3, 2013

Related U.S. Application Data

(60) Provisional application No. 61/502,735, filed on Jun. 29, 2011.

(51) Int. Cl.
*G01J 1/42* (2006.01)
*H05K 1/02* (2006.01)
(Continued)

(52) U.S. Cl.
CPC .......... *H05K 1/0243* (2013.01); *H05K 1/0298* (2013.01); *G02B 6/4246* (2013.01);
(Continued)

(58) Field of Classification Search
CPC ... G02B 6/4201; G02B 6/4202; G02B 6/4256; G02B 6/4257; G02B 6/4259; G02B 6/426; G02B 6/4261; G02B 6/4262; G02B 6/4263; G02B 6/4265; G02B 6/4295; H05K 1/0243; H05K 1/0298
(Continued)

(56) References Cited

U.S. PATENT DOCUMENTS 7,249,897 B2   7/2007 Aruga
7,286,372 B2 * 10/2007 Aronson .............. H05K 9/0058
                                              174/260
(Continued)

FOREIGN PATENT DOCUMENTS

CN    101688955 A    3/2010
EP    2 254 196 A1   11/2010
(Continued)

OTHER PUBLICATIONS

International Search Report and Written Opinion mailed Dec. 28, 2012 as received in PCT Application No. PCT/US2012/044414.
(Continued)

*Primary Examiner* — Georgia Y Epps
*Assistant Examiner* — Kevin Wyatt
(74) *Attorney, Agent, or Firm* — Maschoff Brennan

(57) ABSTRACT

Multichannel RF Feedthroughs. In some examples, a multichannel RF feedthrough includes an internal portion and an external portion. The internal portion includes a top surface on which first and second sets of traces are formed. Each set of traces is configured as an electrical communication channel to carry electrical data signals. The external portion includes a bottom surface on which the first set of traces is formed and a top surface on which the second set of traces is formed. A set of vias connects the first set of traces between the top surface of the internal portion and the bottom surface of the external portion.

13 Claims, 22 Drawing Sheets

(51) Int. Cl.
   *H05K 1/11* (2006.01)
   *H05K 1/14* (2006.01)
   *G02B 6/42* (2006.01)

(52) U.S. Cl.
   CPC .......... *G02B 6/4279* (2013.01); *G02B 6/4292* (2013.01); *H05K 1/0219* (2013.01); *H05K 1/0274* (2013.01); *H05K 1/0284* (2013.01); *H05K 1/117* (2013.01); *H05K 1/147* (2013.01); *H05K 2201/0949* (2013.01); *H05K 2201/09227* (2013.01); *H05K 2201/09409* (2013.01); *H05K 2201/09618* (2013.01); *H05K 2201/09672* (2013.01); *H05K 2201/10121* (2013.01)

(58) Field of Classification Search
   USPC ............ 250/227.11; 385/14, 15, 92–94, 101; 398/115, 135, 137, 201
   See application file for complete search history.

(56) References Cited

U.S. PATENT DOCUMENTS

| | | | | |
|---|---|---|---|---|
| 7,476,039 | B2 * | 1/2009 | Moore | 385/92 |
| 7,507,034 | B2 | 3/2009 | Moore et al. | |
| 7,543,995 | B2 * | 6/2009 | Ice | 385/92 |
| 2003/0174454 | A1 * | 9/2003 | Fu et al. | 361/103 |
| 2004/0086240 | A1 * | 5/2004 | Togami | G02B 6/4246 385/92 |
| 2004/0196642 | A1 | 10/2004 | Aronson et al. | |
| 2005/0168957 | A1 | 8/2005 | Kawauchi | |
| 2005/0213994 | A1 * | 9/2005 | Dudek et al. | 398/202 |
| 2005/0244111 | A1 | 11/2005 | Wolf et al. | |
| 2005/0245103 | A1 * | 11/2005 | Ellison | 439/61 |
| 2006/0029332 | A1 * | 2/2006 | Chiu et al. | 385/53 |
| 2006/0118331 | A1 | 6/2006 | Nelson et al. | |
| 2006/0263013 | A1 * | 11/2006 | Sone | G02B 6/4201 385/89 |
| 2008/0212972 | A1 * | 9/2008 | Nelson et al. | 398/135 |
| 2008/0287007 | A1 | 11/2008 | Tu et al. | |
| 2009/0148106 | A1 | 6/2009 | Moore et al. | |
| 2010/0039134 | A1 | 2/2010 | Herrick et al. | |
| 2011/0188863 | A1 * | 8/2011 | Mason et al. | 398/137 |
| 2013/0001410 | A1 | 1/2013 | Zhao et al. | |
| 2016/0127044 | A1 * | 5/2016 | Ho | H04B 10/40 398/79 |

FOREIGN PATENT DOCUMENTS

| | | |
|---|---|---|
| FR | 2 890 457 A1 | 3/2007 |
| JP | 2002198543 A | 7/2002 |
| JP | 2005-294479 | 10/2005 |
| JP | 2005-328032 | 11/2005 |
| KR | 20140027517 | 3/2014 |
| WO | 2011/059682 A1 | 5/2011 |

OTHER PUBLICATIONS

Extended European Search Report dated Apr. 16, 2015 as received in Application No. 12803948.4, 4 pgs.

* cited by examiner

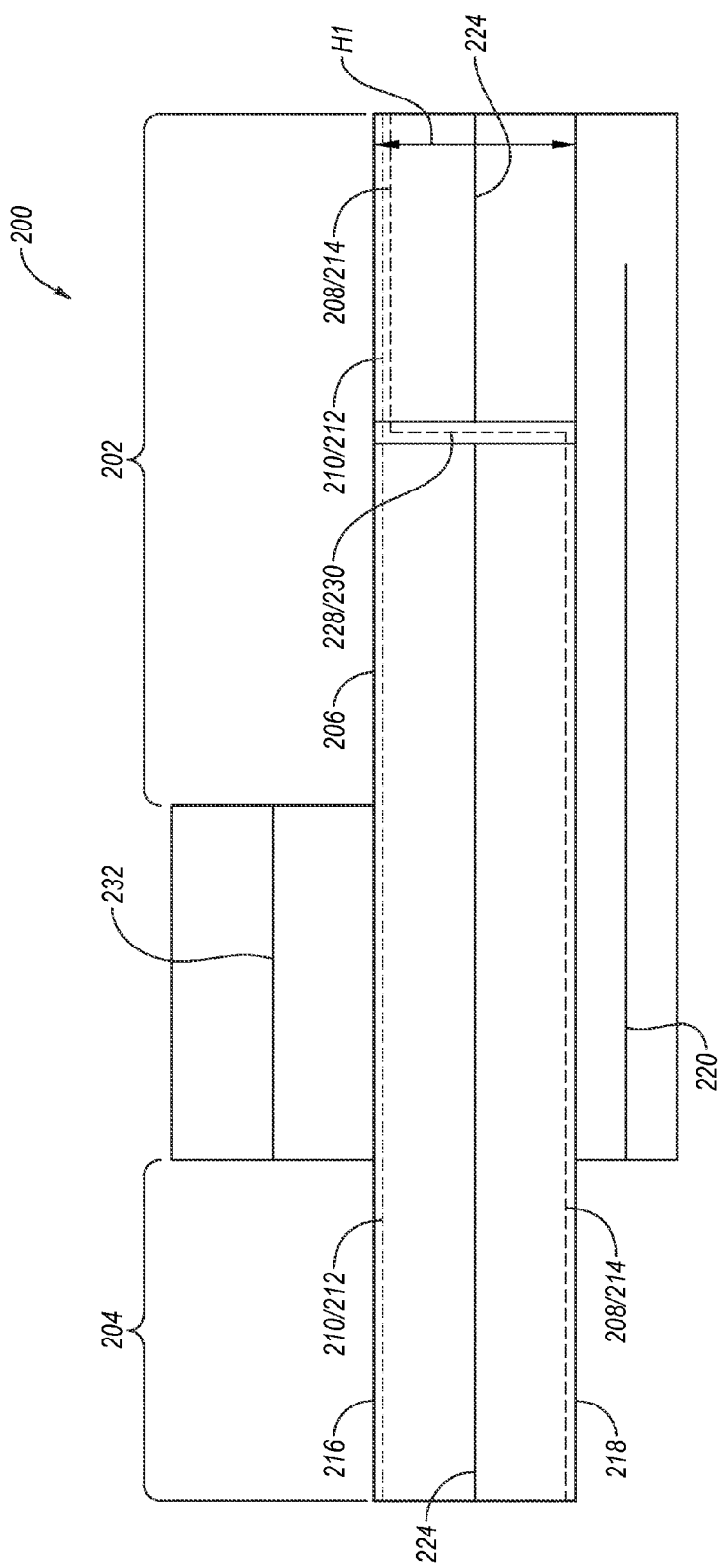

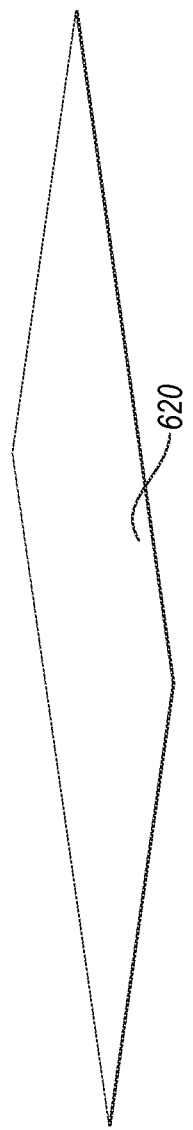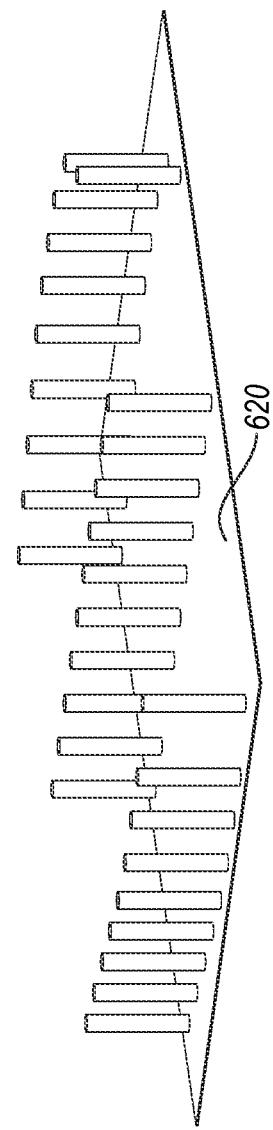

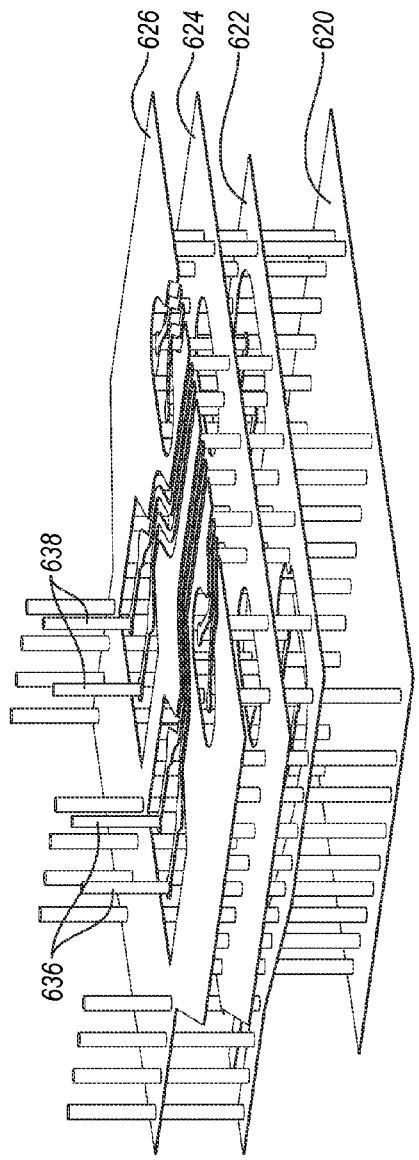
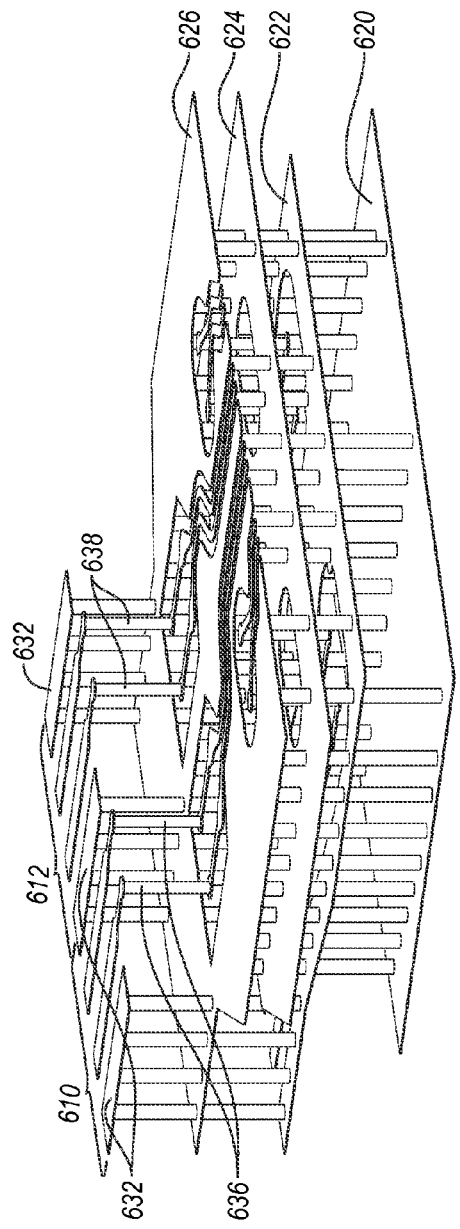

MULTICHANNEL RF FEEDTHROUGHS

CROSS-REFERENCE TO A RELATED APPLICATION

This application claims priority to, and the benefit of, U.S. Provisional Patent Application Ser. No. 61/502,735 titled "MULTICHANNEL RF FEEDTHROUGHS IN AN OPTOELECTRONIC MODULE" and filed on Jun. 29, 2011, which is incorporated herein by reference in its entirety.

BACKGROUND

High speed optical transceiver modules communicate at speeds such as 40 Gbps and 100 Gbps. Multi-Source Agreements (MSAs) for high speed modules often require relatively small packaging and multiple optical and electrical communication channels within the packaging. Potentially problematic interconnections within a high speed module are the RF feedthroughs in the optical subassemblies of the high speed module. It can be difficult to meet MSA requirements in the RF feedthroughs of optical subassemblies in terms of package dimensions, bandwidth, channel density, and manufacturability.

SUMMARY

Technologies described herein generally relate to multichannel RF feedthroughs that can be employed in various applications including, but not limited to, optical subassemblies of optoelectronic modules.

In some examples, a multichannel RF feedthrough includes an internal portion and an external portion. The internal portion includes a top surface on which first and second sets of traces are formed. Each set of traces is configured as an electrical communication channel to carry electrical data signals. The external portion includes a bottom surface on which the first set of traces is formed and a top surface on which the second set of traces is formed. A set of vias connects the first set of traces between the top surface of the internal portion and the bottom surface of the external portion.

In some examples, an optical subassembly (OSA) includes a housing, an optical transducer positioned within the housing, an optical port defined in the housing through which optical data signals can pass between the optical transducer and an optical fiber, and a multichannel RF feedthrough formed in the housing. The multichannel RF feedthrough includes an internal portion and an external portion. The internal portion includes a top surface on which first and second sets of traces are formed. Each set of traces is configured as an electrical communication channel to carry electrical data signals to or from the optical transducer. The external portion includes a bottom surface on which the first set of traces is formed and a top surface on which the second set of traces is formed. The set of vias connects the first set of traces between the top surface of the internal portion and the bottom surface of the external portion.

In some examples, an optoelectronic module includes a shell, a printed circuit board at least partially positioned within the shell, and an OSA at least partially positioned within the shell. The OSA includes a housing, an optical transducer positioned within the housing, an optical port defined in the housing through which optical data signals can pass between the optical transducer and an optical fiber, and a multichannel RF feedthrough formed in the housing. The multichannel RF feedthrough includes an internal portion and an external portion. The internal portion includes a top surface on which first, second, third, and fourth sets of traces are formed. Each set of traces is configured as an electrical communication channel to carry electrical data signals between the optical transducer and the printed circuit board. The external portion includes a top surface on which the second and third sets of traces are formed and a bottom surface on which the first and fourth sets of traces are formed. First and second sets of vias connect the first and fourth sets of traces, respectively, between the top surface of the internal portion and the bottom surface of the external portion.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the drawings:

FIG. 4 is a schematic side view of the example multichannel RF feedthrough of FIG. 2A;

FIGS. 7A-7I are a series of perspective views of various layers and vias within the example multichannel RF feedthrough of FIG. 6A;

DETAILED DESCRIPTION

Figure 1A:
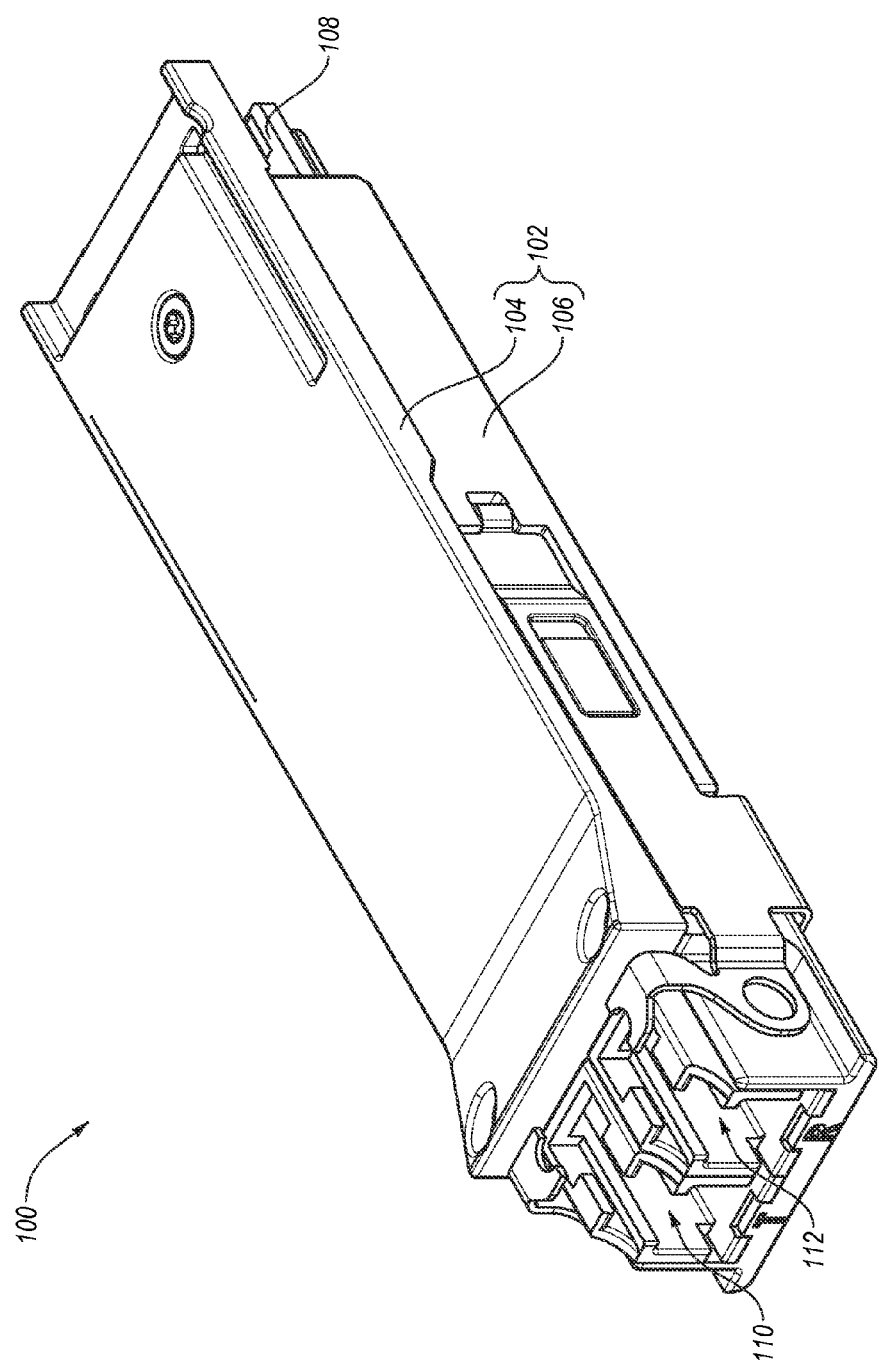
FIG. 1A is a top front perspective view of an example optoelectronic module.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

Some embodiments described herein generally relate to multichannel RF feedthroughs that can be employed in various applications including, but not limited to, optical subassemblies of optoelectronic modules. More particularly, the example multichannel RF feedthroughs disclosed herein can be employed in one or more optical subassemblies of optoelectronic transmitter, receiver, or transceiver modules. As disclosed herein, each multichannel RF feedthrough generally includes double-side accessibility, on top and bottom surfaces, to the traces on an external portion of the multichannel RF feedthrough. Compared to a multichannel RF feedthrough having only single-side accessibility, the double-side accessibility of each example multichannel RF feedthrough disclosed herein can reduce the width of the external portion of the multichannel RF feedthrough by as much as half while retaining the same channel capacity.

Figure 1B:
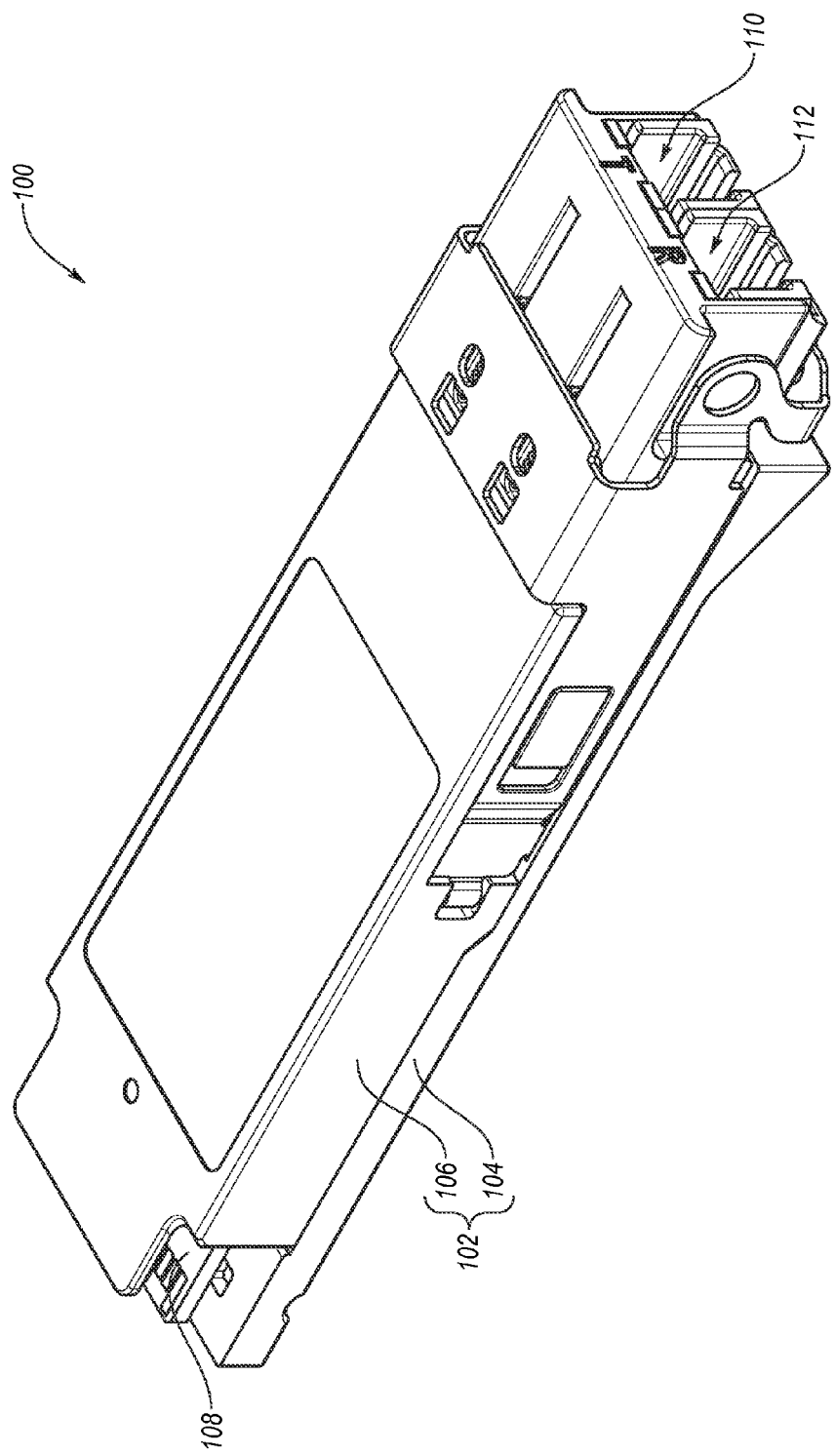
FIG. 1B is a bottom rear perspective view of the example optoelectronic module of FIG. 1A.
Figure 1C:
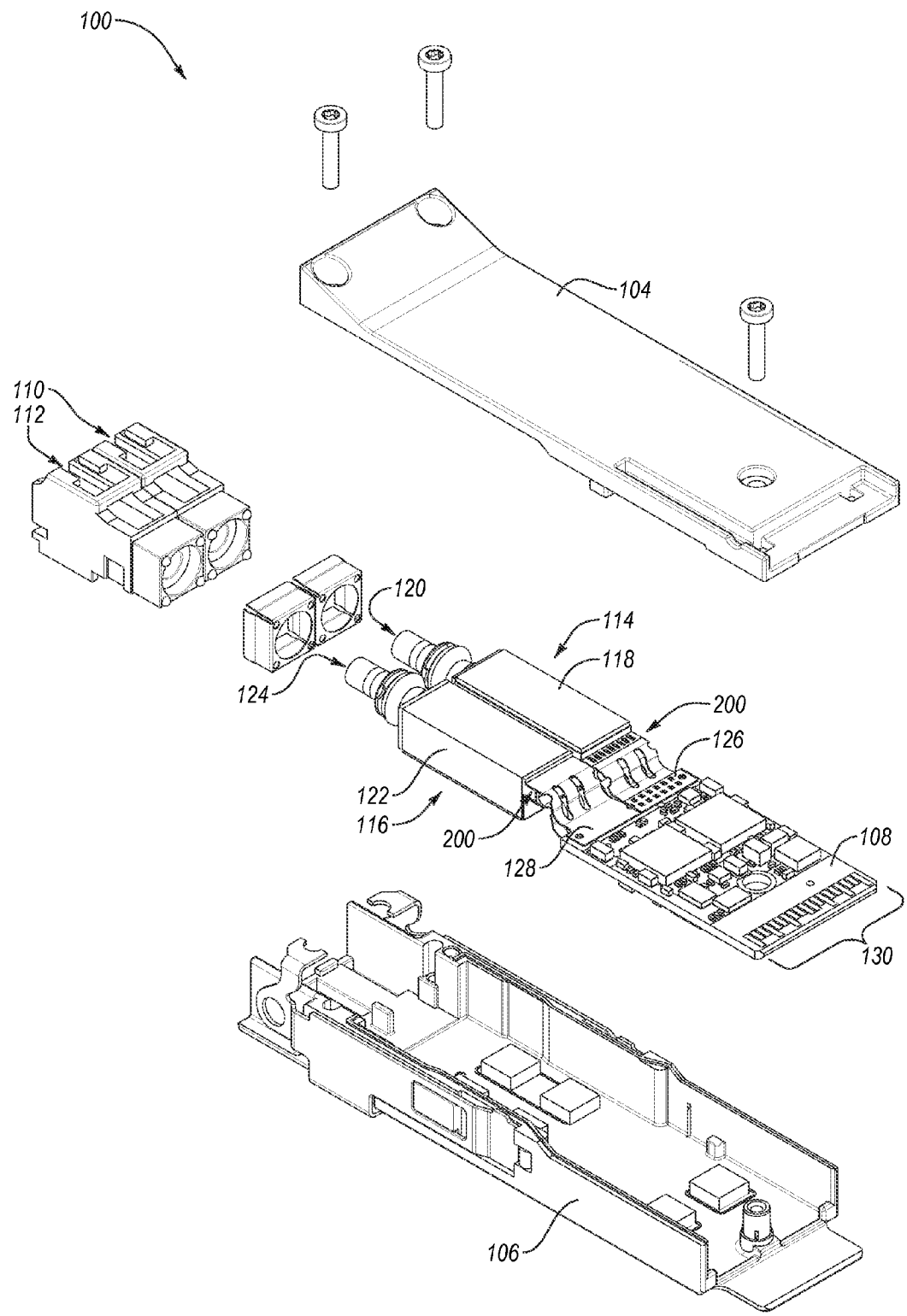
FIG. 1C is a top rear exploded view of the example optoelectronic module of FIG. 1A including two example optical subassemblies each having an example multichannel RF feedthrough.
Figure 1D:
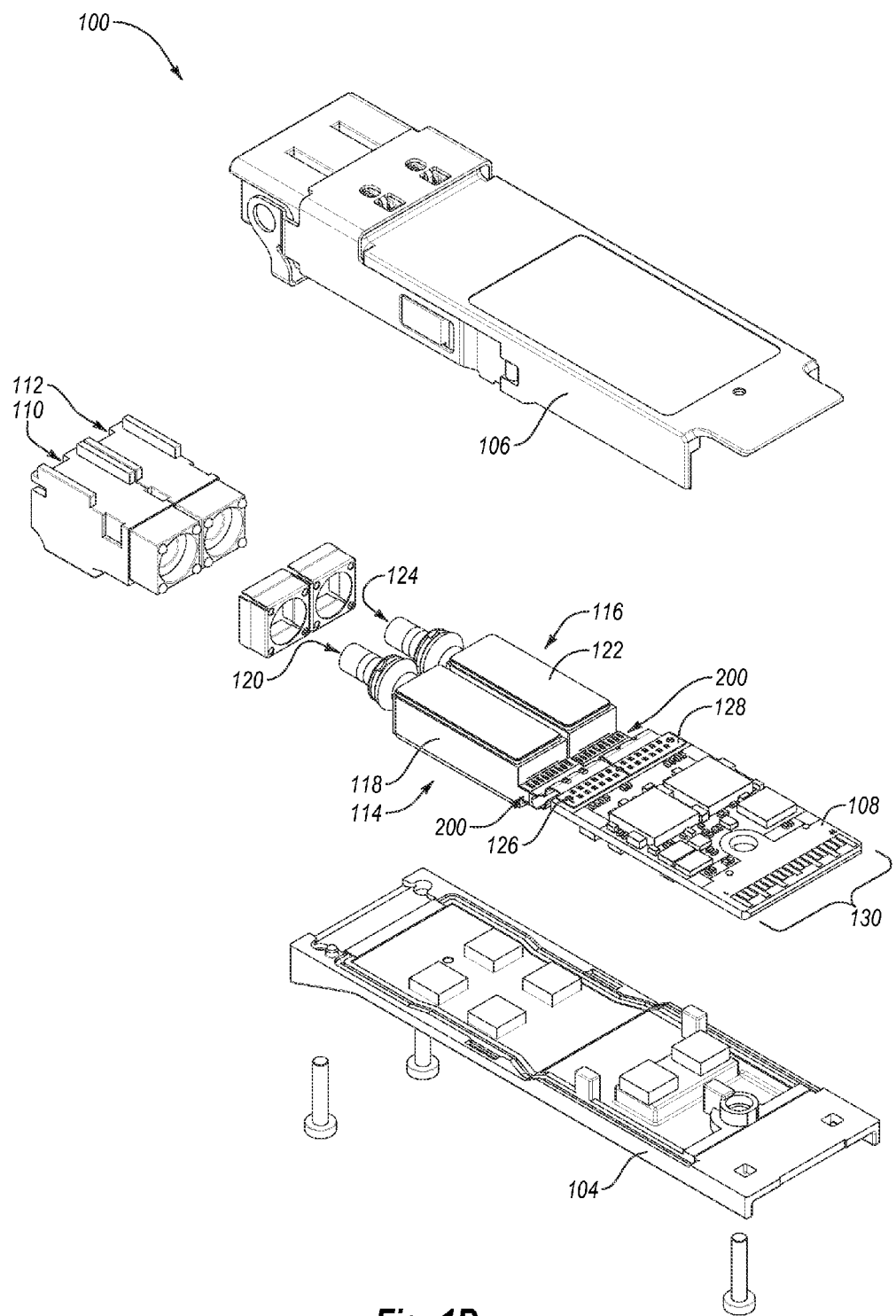
FIG. 1D is a bottom rear exploded view of the example optoelectronic module of FIG. 1A including the two example optical subassemblies and the example multichannel RF feedthroughs of FIG. 1C.

FIGS. 1A-1D disclose various views of an example optoelectronic module 100. In particular, FIG. 1A is a top front perspective view, FIG. 1B is a bottom rear perspective view, FIG. 1C is a top rear exploded view, and FIG. 1D is a bottom rear exploded view of the example optoelectronic module 100. In general, the module 100 can be employed in the communication of optical data signals in connection with a host device (not shown) being employed in the communication of corresponding electrical data signals.

The module 100 can be configured for optical data signal transmission and reception at a variety of data rates including, but not limited to, 1.25 Gbps, 2.125 Gbps, 2.5 Gbps, 4.25 Gbps, 8.5 Gbps, 10.3 Gbps, 10.5 Gbps, 11.3 Gbps, 14.025 Gbps, 40 Gbps, or 100 Gbps, or higher. Furthermore, the module 100 can be configured for optical data signal transmission and reception at various wavelengths including, but not limited to, 850 nm, 1310 nm, 1470 nm, 1490 nm, 1510 nm, 1530 nm, 1550 nm, 1570 nm, 1590 nm, or 1610 nm. Also, the module 100 can be configured to support various communication protocols including, but not limited to, Optical Fast Ethernet, Optical Gigabit Ethernet, 10 Gigabit Ethernet, and 1×, 2×, 4×, 8×, and 16× Fibre Channel. In addition, although one example of the module 100 is configured to have a form factor that is substantially compliant with the QSFP+MSA, the module 100 can alternatively be configured in a variety of different form factors that are substantially compliant with other MSAs including, but not limited to, the CFP MSA, the CFP2 MSA, the CFP4 MSA, or the QSFP MSA. Finally, although the module 100 is a pluggable optoelectronic transceiver module, example multichannel RF feedthroughs disclosed herein can alternatively be employed in connection with pluggable or non-pluggable optoelectronic transmitter or receiver modules or non-pluggable optoelectronic transceiver modules, for example.

As disclosed in FIGS. 1A and 1B, the example module 100 includes a shell 102 that includes a top shell 104 and a bottom shell 106. The bottom shell 106 of the shell 102 includes an opening through which a printed circuit board (PCB) 108 that is at least partially positioned within the shell 102 extends from the rear of the bottom shell 106. The example module 100 also includes a transmit port 110 through which optical data signals are transmitted from the example module 100 using a first optical fiber (not shown) that is connected to the transmit port 110. The example module 100 further includes a receive port 112 through which optical data signals are received by the example module 100 using a second optical fiber (not shown) that is connected to the receive port 112. The ports 110 and 112 are configured to connect the module 100 with optical fibers and corresponding optical fiber connectors such as LC or SC connectors (not shown).

As disclosed in FIGS. 1C and 1D, the example module 100 also includes a pair of optical subassemblies (OSAs), namely, a transmitter optical subassembly (TOSA) 114 and a receiver optical subassembly (ROSA) 116. The TOSA 114 includes a housing 118 and an optical port 120 defined in the housing 118. Similarly, the ROSA 116 includes a housing 122 and an optical port 124 defined in the housing 122. The PCB 108 is in electrical communication with the TOSA 114 through a first multichannel RF feedthrough 200, defined in the housing 118 of the TOSA 114, and a flexible electrical interface 126. The PCB 108 is also in electrical communication with the ROSA 116 through a second multichannel RF feedthrough 200, defined in the housing 122 of the ROSA 116, and a flexible electrical interface 128.

The flexible electrical interfaces 126 and 128 are configured to connect to both top surfaces (as shown in FIG. 1C) as well as bottom surfaces (as shown in FIG. 1D) of the multichannel RF feedthroughs 200 in order to reduce the width of the multichannel RF feedthroughs 200. This reduction in the width of the multichannel RF feedthroughs 200 can help reduce the overall width of the TOSA housing 118 and the ROSA housing 122, thus allowing for a corresponding reduction in the overall width of the bottom shell 106.

The PCB 108 includes an edge connector 130 that extends outside the bottom shell 106 and is configured to be electrically coupled to a host connector (not shown) once the module 100 is inserted into a host cage (not shown) of a host device (not shown). The TOSA 114 further includes one or more optical transmitters, such as lasers (not shown), positioned within the housing 118. Similarly, the ROSA 116 further includes one or more optical receivers (not shown) positioned within the housing 122.

In operation, electrical data signals from a host device (not shown) travel through the edge connector 130 of the PCB 108, various circuitry on the PCB 108, the flexible electrical interface 126, and the first multichannel RF feedthrough 200 into the housing 118 and to the one or more transmitters (not shown) positioned within the housing 118. Each optical transmitter is configured to convert the electrical data signals into corresponding optical data signals and transmit the optical data signals out of the housing 118 through the optical port 120 and the transmit port 110 into a first optical fiber (not shown) that is connected to the transmit port 110. Similarly, optical data signals from a second optical fiber (not shown) that is connected to the receive port 112 travel through the receive port 112 and the optical port 124, into the housing 122 and to the one or more optical receivers (not shown) positioned within the housing 122. Each optical receiver is configured to convert optical data signals into corresponding electrical data signals that are relayed outside the housing 122 through the second multichannel RF feedthrough 200 and to the host device (not shown) through the flexible electrical interface 128, various circuitry on the PCB 108, and the edge connector 130. Since each transmitter and receiver is configured to convert between optical and electrical data signal, each transmitter and receiver is an optical transducer.

Having described a specific environment with respect to FIGS. 1A-1D, it will be understood that this specific environment is only one of countless architectures in which example embodiments of the present invention may be employed. The scope of the present invention is not intended to be limited to any particular environment.

Figure 2A:
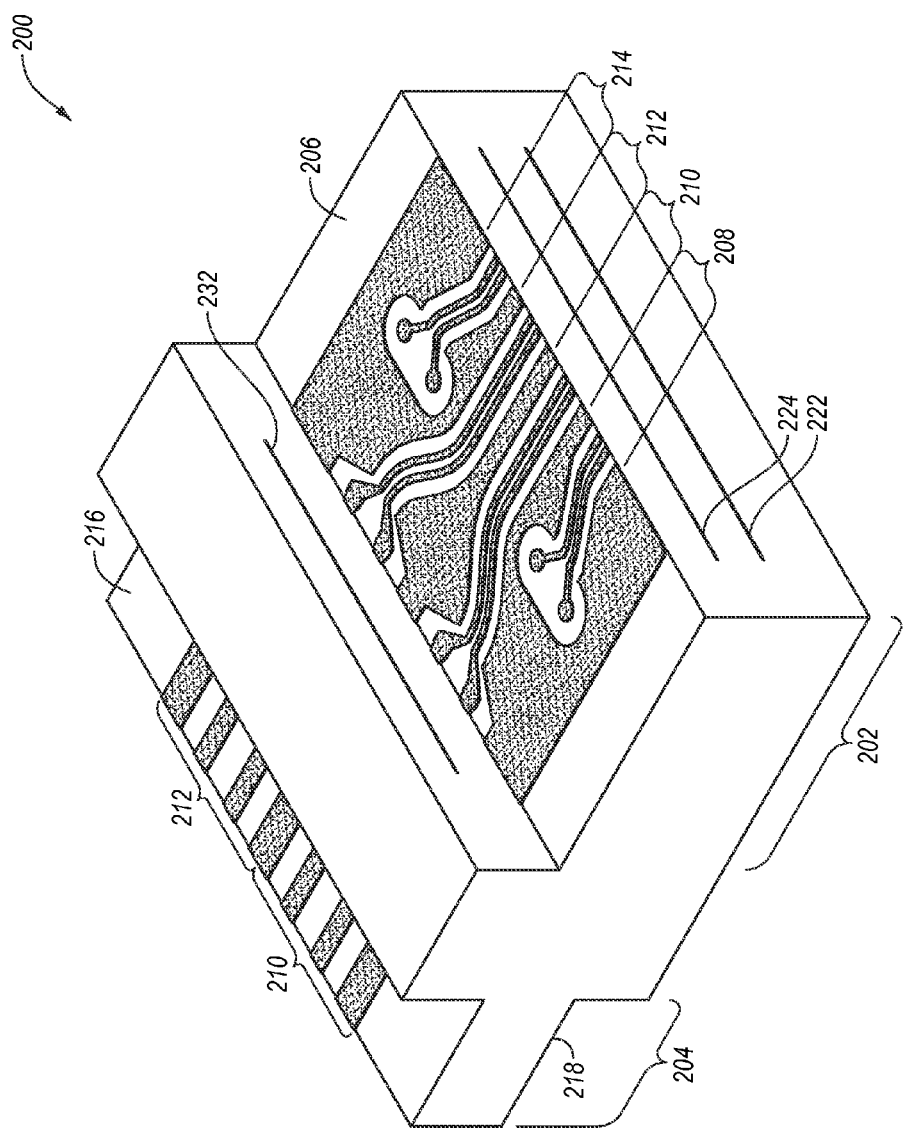
FIG. 2A is a perspective view of one of the example multichannel RF feedthroughs of FIG. 1C.
Figure 2B:
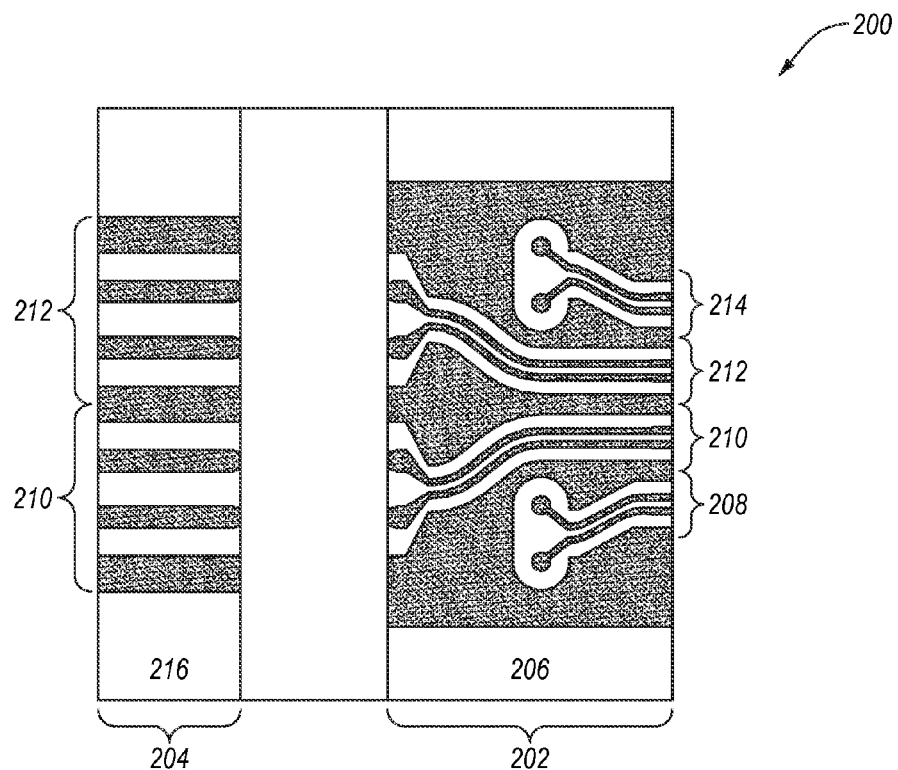
FIG. 2B is a top view of the example multichannel RF feedthrough of FIG. 2A.
Figure 2C:
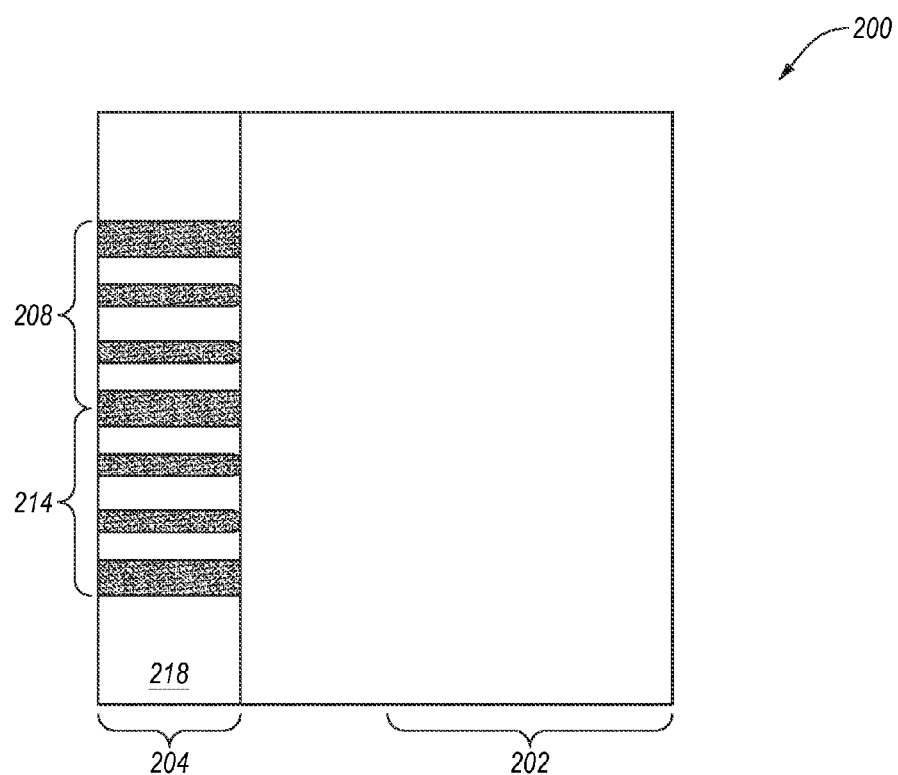
FIG. 2C is a bottom view of the example multichannel RF feedthrough of FIG. 2A.

FIGS. 2A-2C disclose various views of one of the example multichannel RF feedthroughs 200 of FIGS. 1C and 1D. In particular, FIG. 2A is a perspective view, FIG. 2B is a top view, and FIG. 2C is a bottom view of the example multichannel RF feedthrough 200.

As disclosed in FIGS. 2A and 2B, the feedthrough 200 includes an internal portion 202 and an external portion 204. The internal portion 202 may reside inside a corresponding device housing (such as the TOSA housing 118 of FIG. 1C) and the external portion 204 may reside outside a corresponding device housing. The internal portion 202 includes a top surface 206 on which first, second, third, and fourth sets of traces 208, 210, 212, and 214 are formed. Each set of traces 208, 210, 212, and 214 may be configured as an electrical communication channel to carry electrical data signals. In order to distinguish between the electrical communication channels, the first, second, third, and fourth sets of traces 208, 210, 212, and 214 are designated herein "Channel 1," "Channel 2," "Channel 3," and "Channel 4," respectively.

As disclosed in FIGS. 2A-2C, the external portion 204 includes including a top surface 216 on which the second and third sets of traces 210 and 212 are formed and a bottom surface 218 on which the first and fourth sets of traces 208 and 214 are formed. Accordingly, the external portion 204 includes traces for Channels 2 and 3 on the top surface 216, as disclosed in FIG. 2B, and traces for Channels 1 and 4 on the bottom surface 218, as disclosed in FIG. 2C.

The accessibility of Channels 2 and 3 on the top surface 216 and Channels 1 and 4 on the bottom surface 218 of the external portion 204 may reduce the packaging width of these four channels. In particular, the traces on the top and bottom surfaces 216 and 218 of the external portion 204 may require a range of about 0.6 mm to about 1 mm pitch in order to properly connect to a corresponding flexible electrical interface (such as the flexible electrical interfaces 126 of FIGS. 1C and 1D). In contrast, the traces on the top surface 206 of the internal portion 202 may have a much narrower range of about 0.1 mm to about 0.25 mm pitch in order to properly connect to a corresponding electrical interface of an optical transducer (not shown). Thus, the spacing between traces in the sets of traces may be greater on the top and bottom surfaces 216 and 218 of the external portion 204 than on the top surface 206 of the internal portion 202. Therefore, the double-side accessibility to the more widely-spaced traces on both the top surface 216 and the bottom surface 218 of the external portion 204 of the example multichannel RF feedthrough 200 may reduce the packaging width by as much as half for the same number of channels.

Figure 3A:
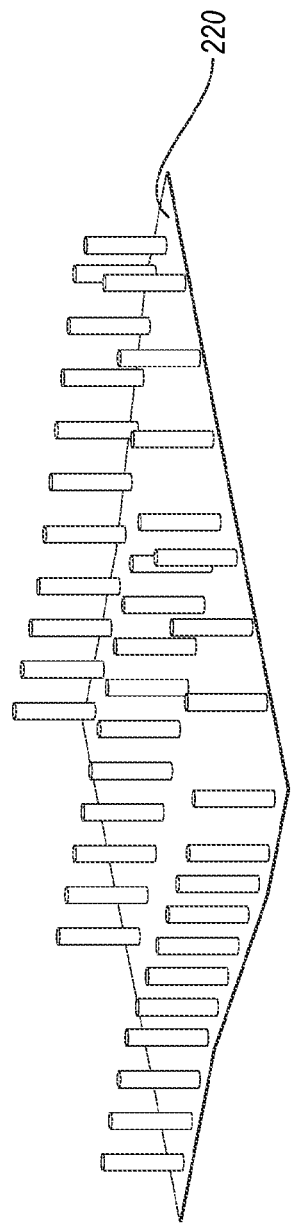
FIGS. 3A-3I are a series of perspective views of various layers and vias within the example multichannel RF feedthrough of FIG. 2A.
Figure 3B:
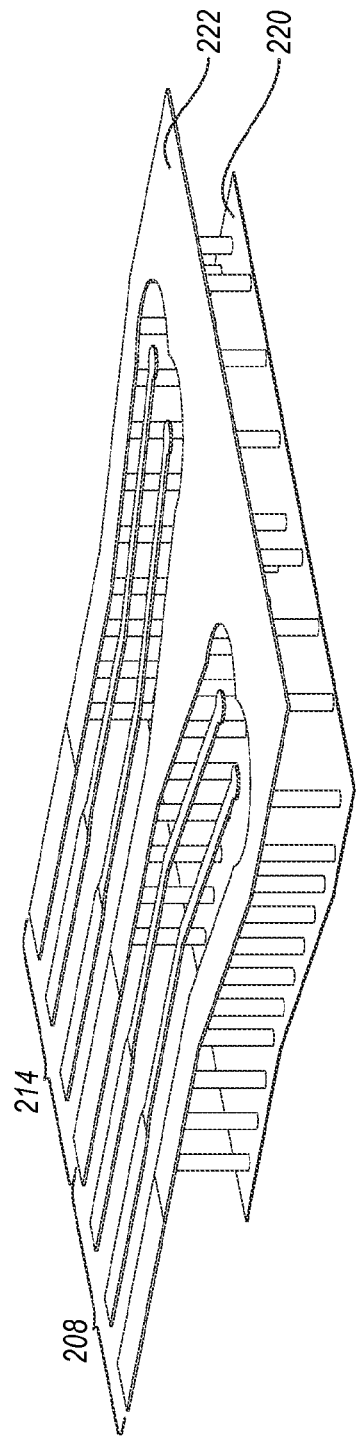
Figure 3C:
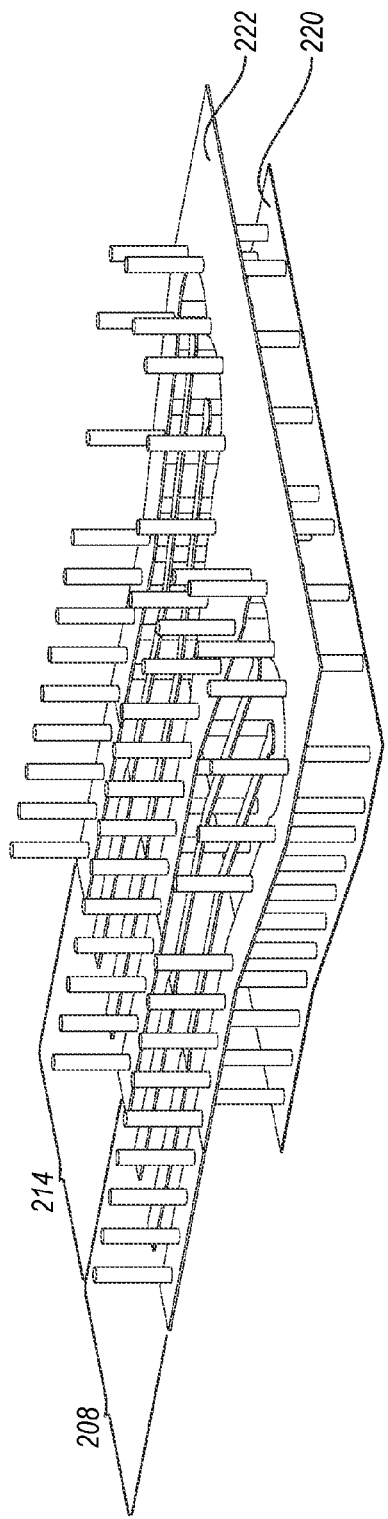
Figure 3D:
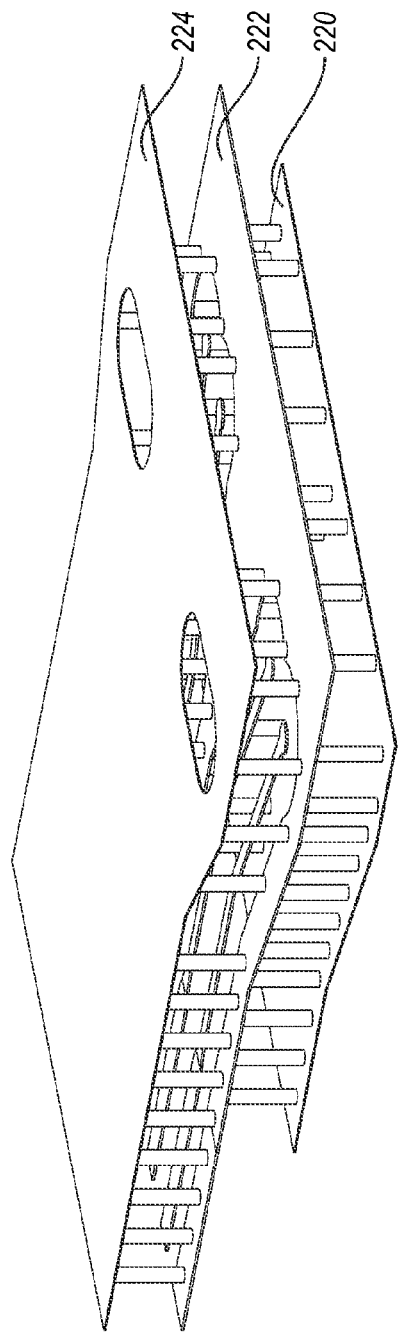

FIGS. 3A-3I are a series of perspective views of various layers and vias within the example multichannel RF feedthrough 200. FIG. 3A shows a first ground shield 220 that functions to shield the bottom portion of an OSA housing (such as the TOSA housing 118 of FIGS. 1C and 1D) from the electrical data signals traveling through the sets of traces 208 and 214 (see FIG. 3B). As disclosed in FIGS. 3A and 3B, the first ground shield 220 is electrically grounded using a plurality of vias that connect with ground traces 222. As disclosed in FIG. 3B, the ground traces 222 form a portion of the first and fourth sets of traces 208 and 214. As disclosed in FIGS. 3C and 3D, the ground traces 222 are electrically grounded using a plurality of vias that connect with a second ground shield 224. The second ground shield 224 is positioned between the top and bottom surfaces 216 and 218 of the external portion 204 (see FIG. 2A) and functions to shield the first and fourth sets of traces 208 and 214 (see FIG. 3B) from the second and third sets of traces 210 and 212 (see FIG. 3F). As disclosed in FIGS. 3E and 3F, the second ground shield 224 is electrically grounded using a plurality of vias that connect with the ground traces 226. As disclosed in FIG. 3F, the ground traces 226 form portions of the second and third sets of traces 210 and 212.

Figure 3E:
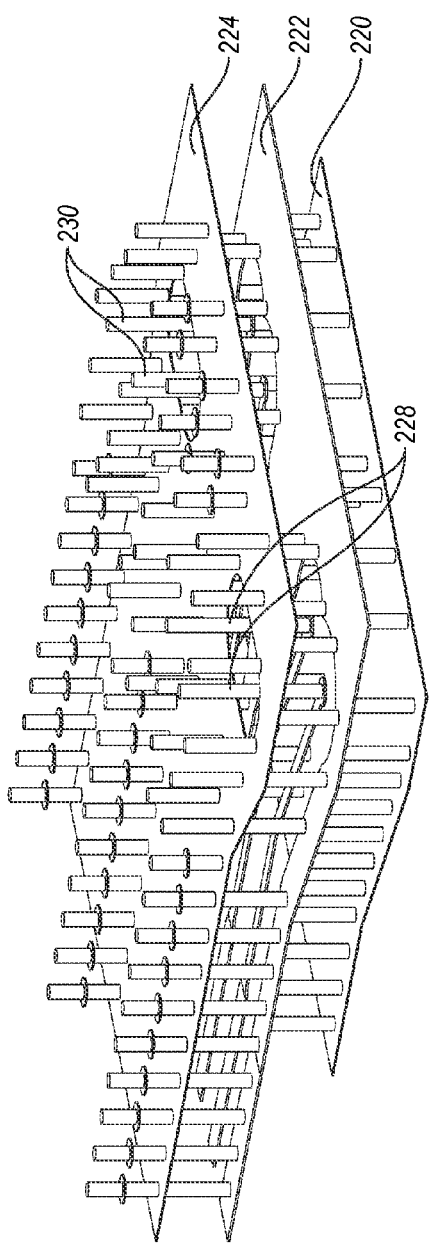
Figure 3F:
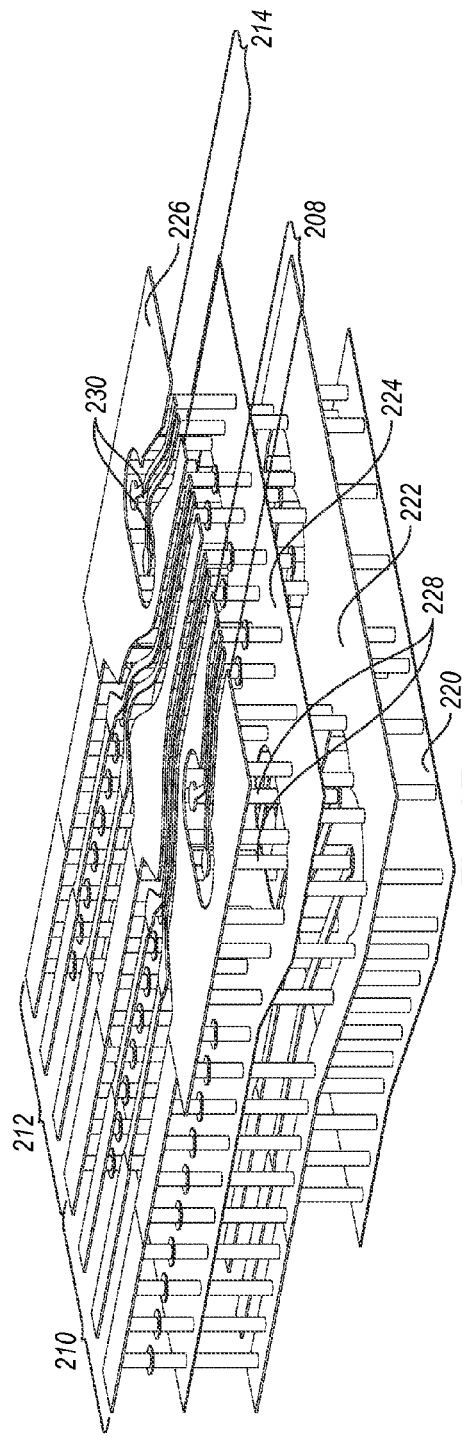

Also disclosed in FIGS. 3E and 3F, the example multichannel RF feedthrough includes first and second sets of vias 228 and 230 connecting the first and fourth sets of traces, respectively, between the top surface 206 of the internal portion 202 and the bottom surface 218 of the external portion 204 (see FIG. 2A).

Figure 3G:
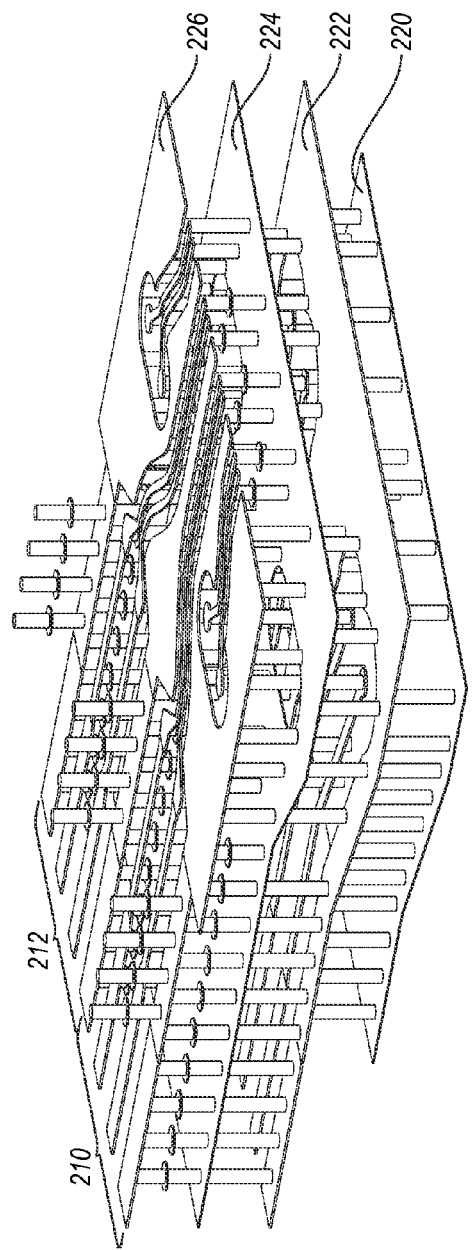
Figure 3H:
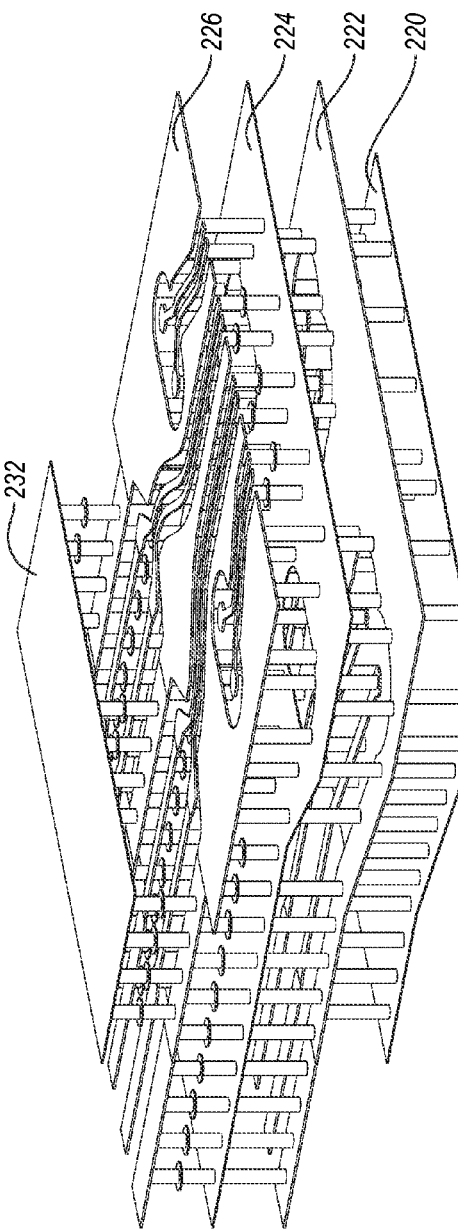
Figure 3I:
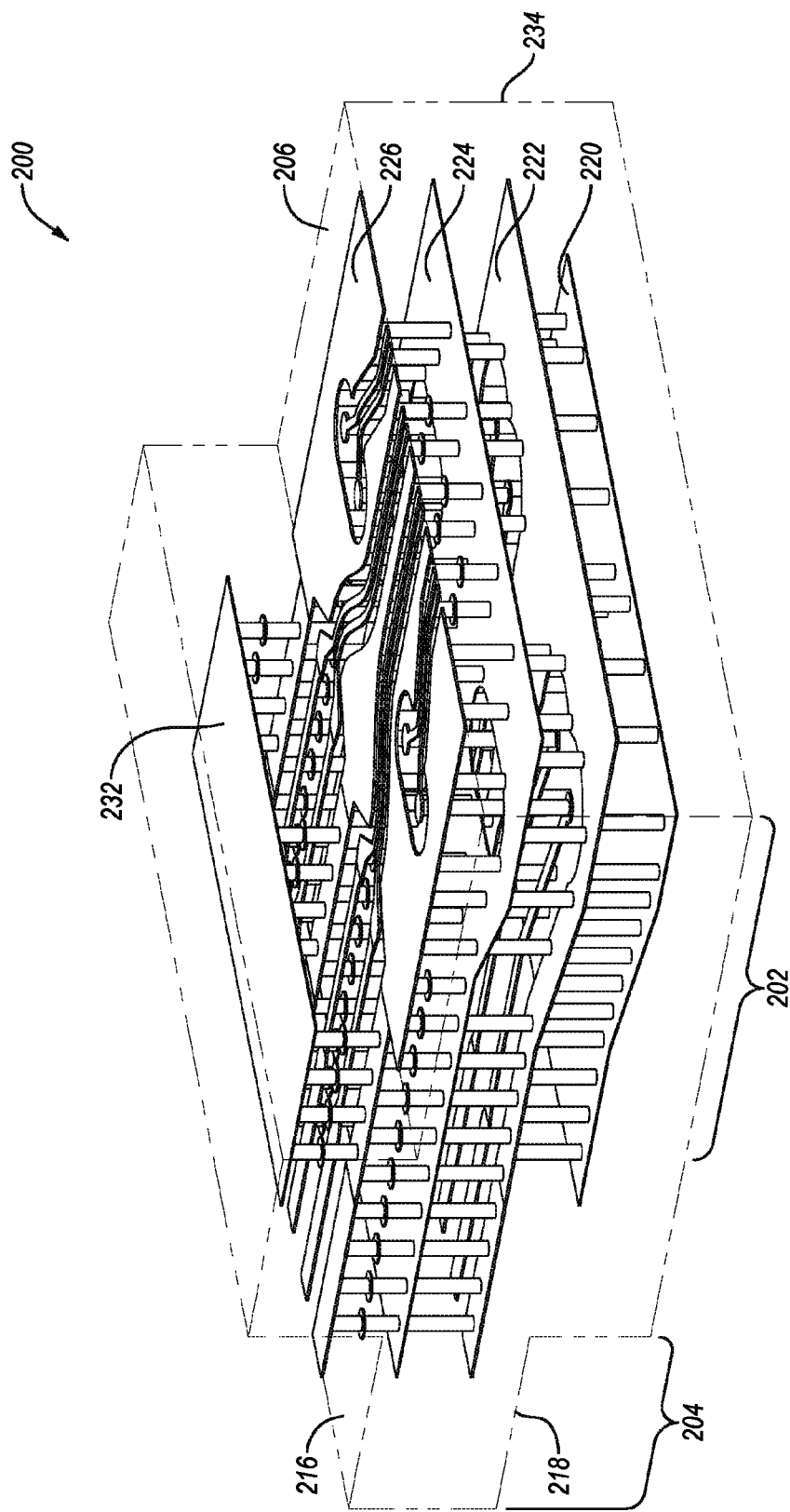

As disclosed in FIGS. 3G and 3H, the ground traces 226 are electrically grounded using a plurality of vias that connect with a third ground shield 232. The third ground shield 232 functions to shield the top portion of an OSA housing, such as the TOSA housing 118 or ROSA housing 122 disclosed in FIGS. 1C and 1D, from the electrical data signals traveling through the second and third sets of traces 210 and 212. FIG. 3I discloses the outline of the insulating structure 234 that is formed around the traces, ground shields, and vias of the example multichannel RF feedthrough 200.

FIG. 4 is a schematic side view of the example multichannel RF feedthrough 200. As disclosed in FIG. 4, the placement of the first, second, third, and fourth sets of traces 208, 210, 212, and 214 on the top surface 206 of the internal portion 202 and the divided placements of the second and third sets of traces 210 and 212 on the top surface 216 and first and fourth sets of traces 208 and 214 on the bottom surface 218 of the external portion 204 requires vias 228 and 230. Thus, electrical data signals can travel on the first and fourth sets of traces 208 and 214 (also referenced herein as Channels 1 and 4) in a non-coplanar path from the top surface 206 of the internal portion 202 to the bottom surface 218 of the external portion 204 using the vias 228 and 230. In contrast, an electrical data signal can travel on the second and third sets of traces 210 and 212 (also referenced herein as Channels 2 and 3) in a coplanar path from the top surface 206 of the internal portion 202 to the top surface 216 of the external portion 204.

The height H1 of the vias 228 and 230, which also corresponds to the distance between the traces on the top and bottom surfaces 216 and 218 of the external portion 204, can vary according to design parameters. For example, in at least some example embodiments, the height H1 may be about 1 mm.

Figure 5:
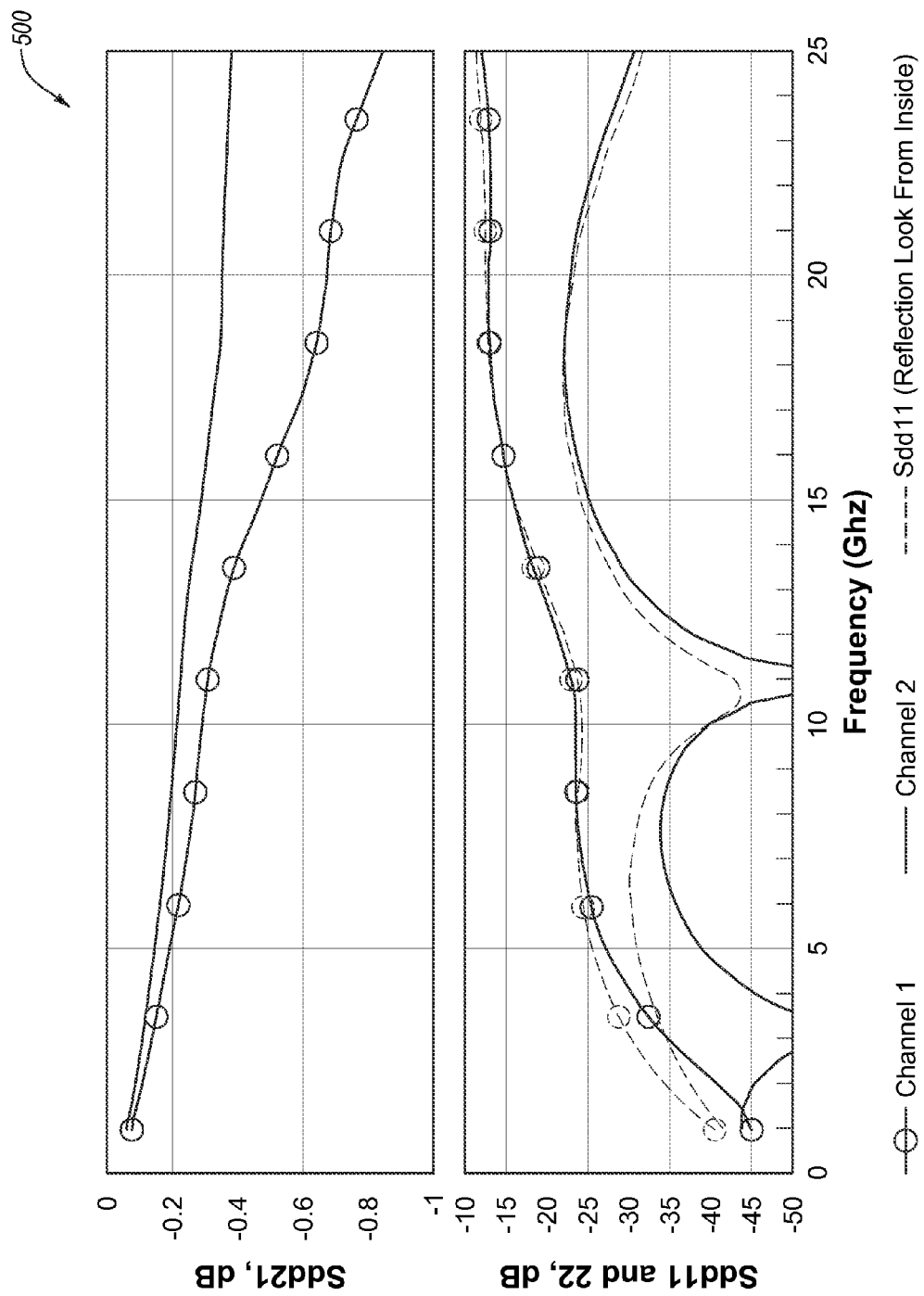
FIG. 5 is a chart showing various simulated performance characteristics of the example multichannel RF feedthrough of FIG. 2A.

FIG. 5 is a chart 500 showing various simulated performance characteristics of the example multichannel RF feedthrough 200. As disclosed in the chart 500 of simulated performance of FIG. 5, on lower half of the graph the dotted lines are reflection (Sdd11) looking from the internal edges of the sets of traces 208 and 210 that make up Channel 1 and Channel 2, while the solid lines are reflection (Sdd22) looking from the external edges of the sets of traces 208 and 210. The chart 500 of simulated performance of FIG. 5 discloses that electronic data signals traveling along the non-coplanar path of Channel 1 perform well at lower frequencies, but experience performance degradation at higher frequencies due to effective via inductance. In particular, the simulation results disclosed in FIG. 5 disclose that the reflection in Channel 1 deteriorates starting from about 5 GHz compared with Channel 2. After about 15 GHz, the reflection level is beyond a −15 dB criteria. This performance gap among channels in the example multichannel RF feedthrough 200 may make the example multichannel RF feedthrough 200 better suited for lower speed (e.g. about 10 Gbps to about 15 Gbps per channel or below) multichannel applications.

With reference now to FIGS. 6A-9, a second example multichannel RF feedthroughs 600 is disclosed. The example multichannel RF feedthrough 600 can be employed in a variety of applications including, but not limited to, the TOSA 114 and/or the ROSA 118 disclosed in FIGS. 1C and 1D. The example multichannel RF feedthrough 600 is similar in many respects to the example multichannel RF feedthrough 200. Therefore, the discussion herein of the example multichannel RF feedthrough 600 will generally be limited to the differences between the example multichannel RF feedthrough 600 and the example multichannel RF feedthrough 200. The example multichannel RF feedthrough 600 has a balanced via distribution to form channels with homogeneous performance.

Figure 6A:
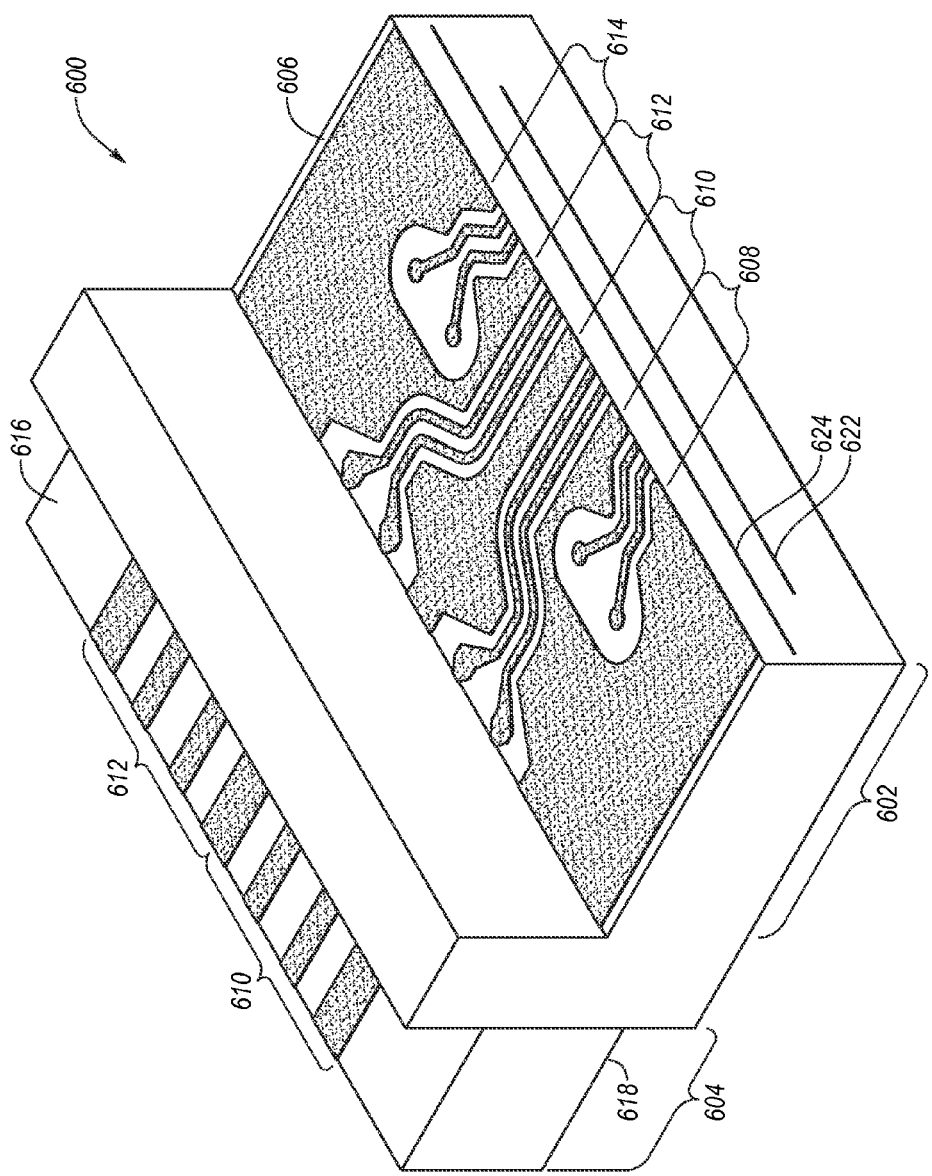
FIG. 6A is a perspective view of a second example multichannel RF feedthrough.
Figure 6B:
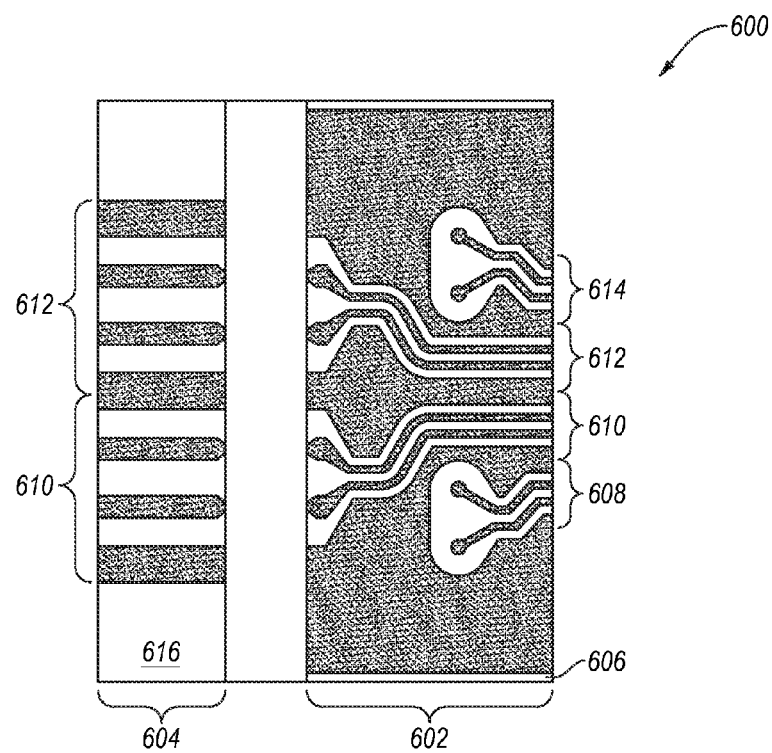
FIG. 6B is a top view of the example multichannel RF feedthrough of FIG. 6A.
Figure 6C:
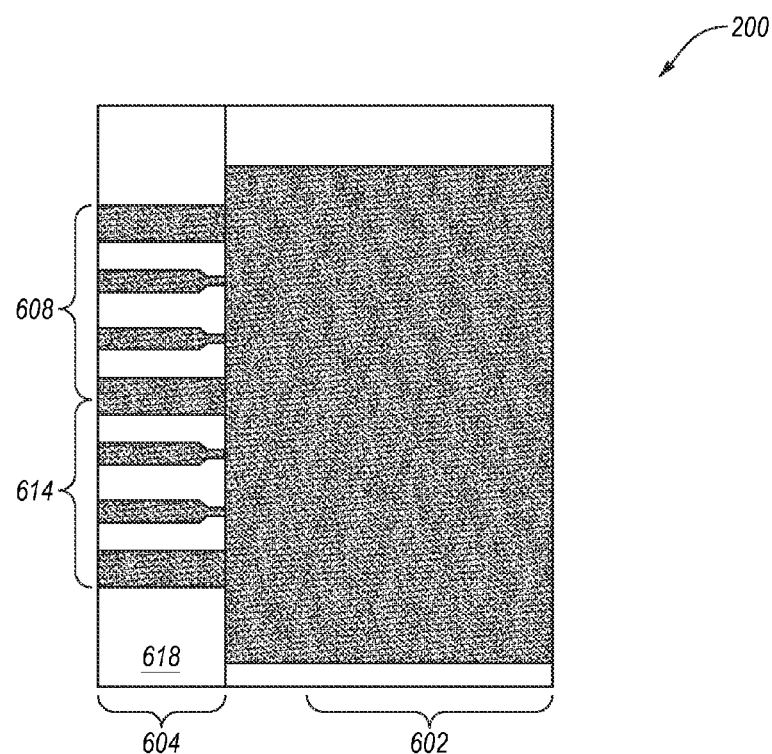
FIG. 6C is a bottom view of the example feedthrough of FIG. 6A.
Figure 7C:
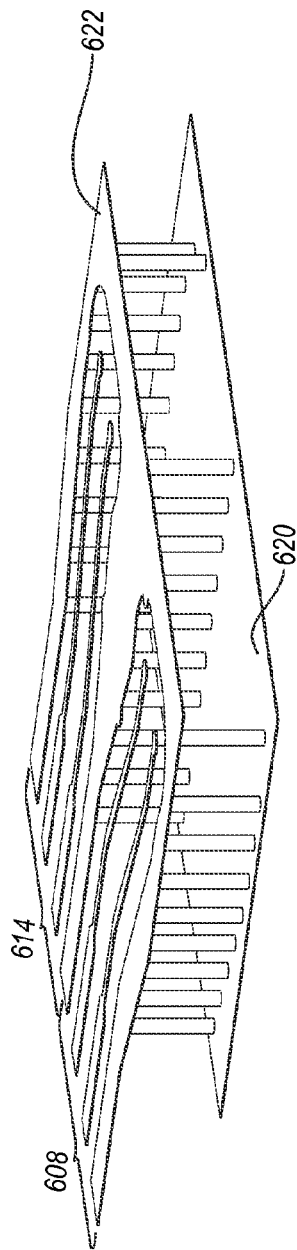
Figure 7D:
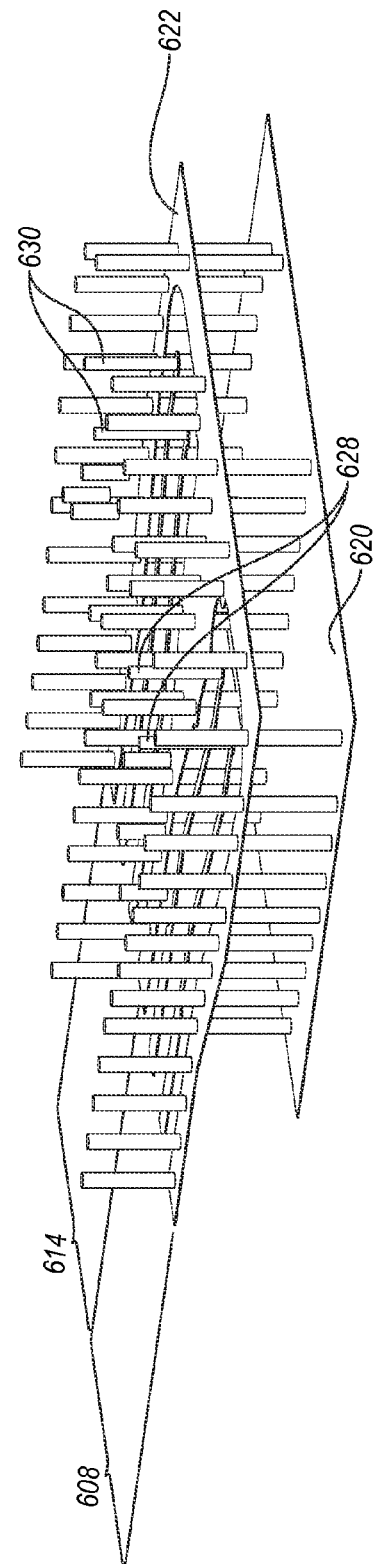
Figure 7E:
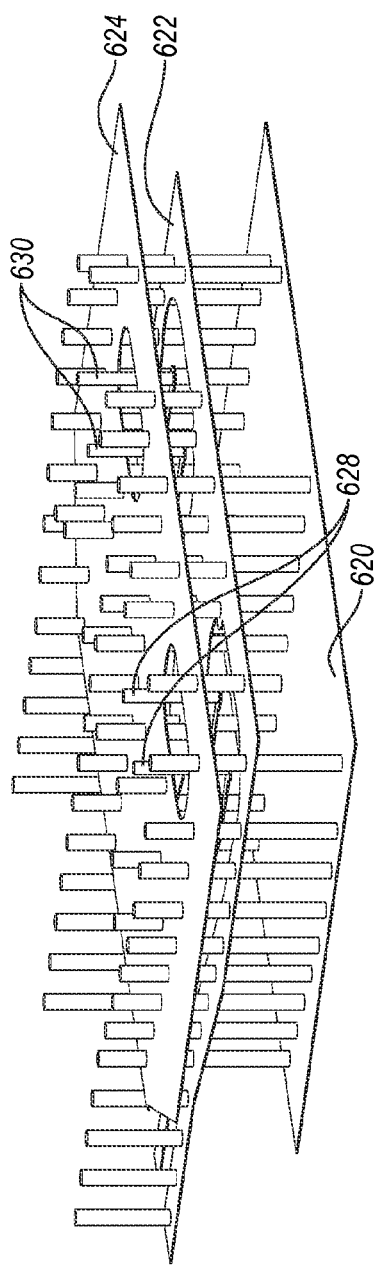
Figure 7F:
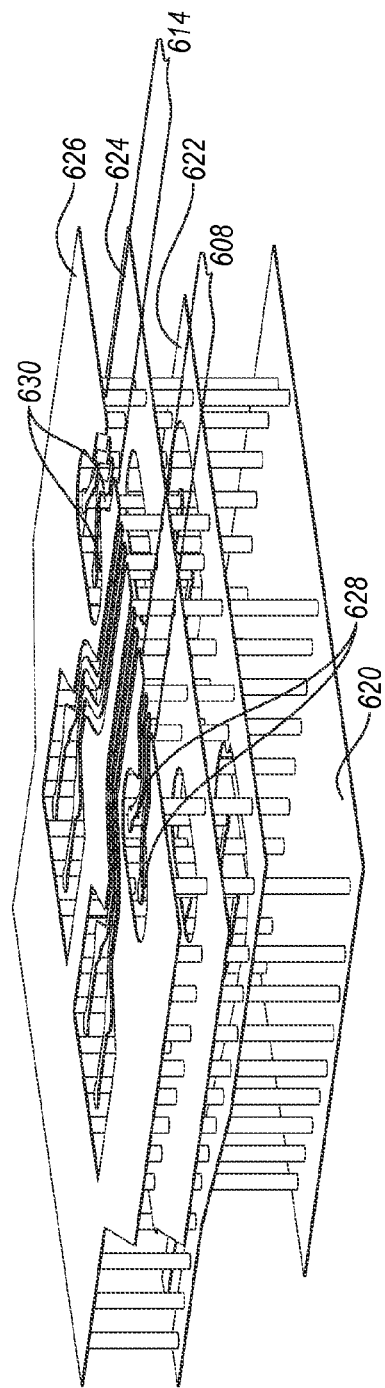
Figure 71:
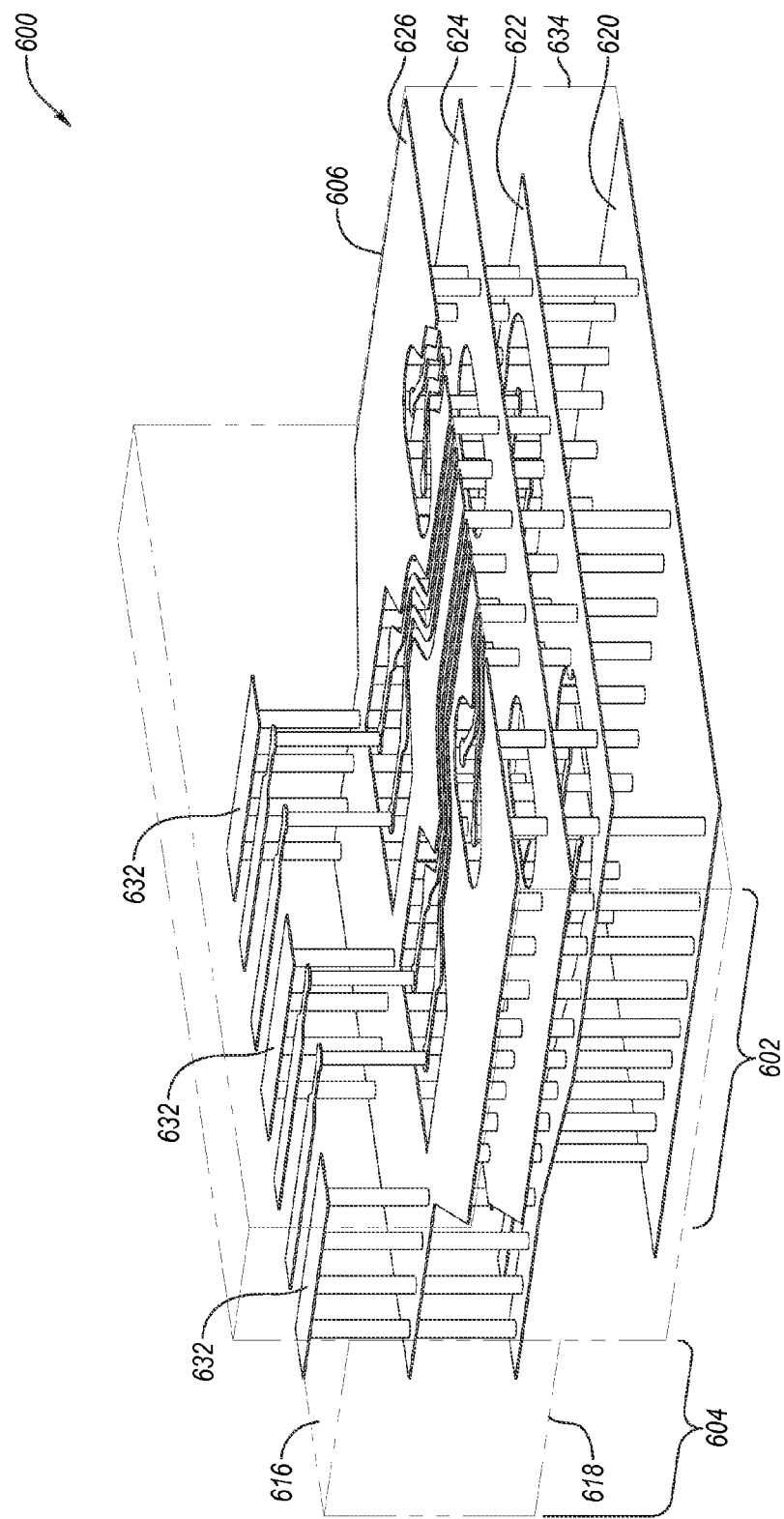

FIGS. 6A-6C disclose various views of a second example multichannel RF feedthroughs 600. In particular, FIG. 6A is a perspective view, FIG. 6B is a top view, and FIG. 6C is a bottom view of the example multichannel RF feedthrough 600. As disclosed in FIGS. 6A-6C, the example multichannel RF feedthrough 600 includes an internal portion 602 with a top surface 606, an external portion 604 with a top surface 616 and a bottom surface 618, and first, second, third, and fourth sets of traces 608, 610, 612, and 614 (also referred to herein as "Channel 1," "Channel 2," "Channel 3," and "Channel 4," respectively). Unlike the top surfaces 202 and 216 of FIG. 2A, however, the top surfaces 606 and 616 are not coplanar.

FIGS. 7A-7I are a series of perspective views of various layers and vias within the example multichannel RF feedthrough 600. As disclosed in FIGS. 7A-7I, the example multichannel RF feedthrough 600 includes a first ground shield 620 that functions to shield the bottom portion of a corresponding device housing (not shown) from the electrical signals traveling through the first and fourth sets of traces 608 and 614, ground traces 622 that form a portion of the first and fourth sets of traces 608 and 614, and a second ground shield 624 that is positioned between the top surfaces 606 of the internal portion 602 and the ground traces 622 and functions to shield the first and fourth sets of traces 608 and 614 from the second and third sets of traces 610 and 612 in the internal portion 602.

The example multichannel RF feedthrough 600 also includes ground traces and shield 626 which forms a portion of the first, second, third, and fourth sets of traces 608, 610, 612, and 614 and also functions to shield the first and fourth sets of traces 608 and 614 from the second and third sets of traces 610 and 612 in the external portion 604. The example multichannel RF feedthrough 600 also includes ground traces 632 that form a portion of the second and third sets of traces 610 and 612. Each of the ground shields and ground traces are electrically grounded and interconnected using a plurality of vias.

As disclosed in FIGS. 7D-7F and 7I, the example multichannel RF feedthrough 600 also includes first and second sets of vias 628 and 630 connecting the first and fourth sets of traces 608 and 614, respectively, between the top surface 606 of the internal portion 602 and the bottom surface 618 of the external portion 604. Similarly, as disclosed in FIGS. 7G-7I, the example multichannel RF feedthrough 600 also includes third and fourth sets of vias 636 and 638 connecting the second and third sets of traces 610 and 612, respectively, between the top surface 606 of the internal portion 602 and the top surface 616 of the external portion 604. FIG. 7I also discloses the outline of the insulating structure 634 that is formed around the traces, ground shields, and vias of the example multichannel RF feedthrough 600.

Figure 8:
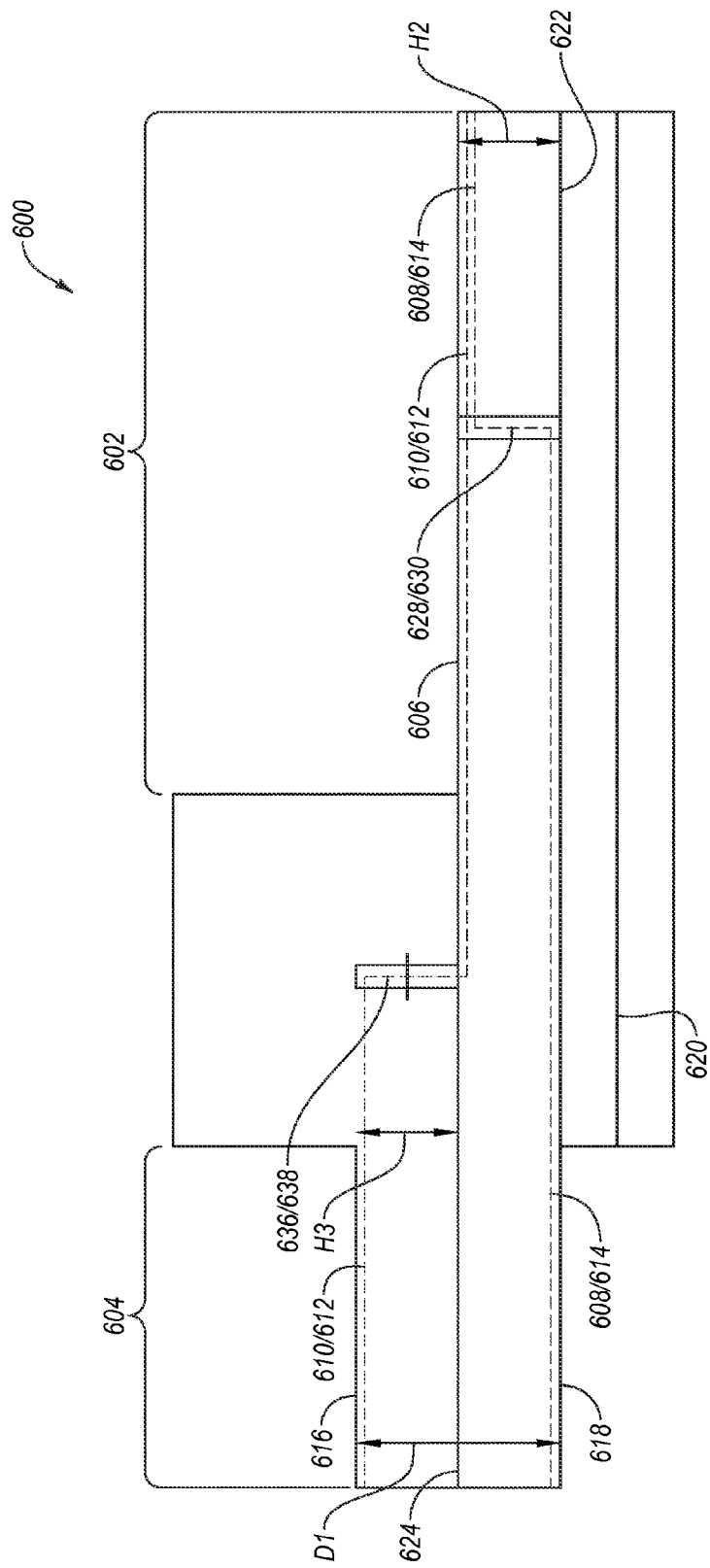
FIG. 8 is a schematic side view of the example multichannel RF feedthrough of FIG. 6A.

FIG. 8 is a schematic side view of the example multichannel RF feedthrough 600. As disclosed in FIG. 8, the top surface 606 of the internal portion 602 lies in a plane that is positioned about half-way between the planes of the top and bottom surfaces 616 and 618 of the external portion 604. This non-coplanar positioning of these surfaces requires vias 628 and 630 as well as vias 636 and 638. Thus, electrical data signals can travel on the first and fourth sets of traces 608 and 614 (also referenced herein as Channels 1 and 4) in a non-coplanar path from the top surface 606 of the internal portion 602 to the bottom surface 618 of the external portion 604 using the vias 628 and 630. Similarly, electrical data signals can travel on the second and third sets of traces 610 and 612 (also referenced herein as Channels 2 and 3) in a non-coplanar path from the top surface 606 of the internal portion 602 to the top surface 616 of the external portion 604 using the vias 636 and 638.

The height H2 of the vias 628 and 630, which also corresponds to the distance between the traces on the top surface 606 of the internal portion 602 and the bottom surface 618 of the external portion 604, can vary according to design parameters. Similarly, the height H3 of the vias 636 and 638, which also corresponds to the distance between the traces on the top surface 606 of the internal portion 602 and the top surface 616 of the external portion 604, can also vary according to design parameters. In at least some example embodiments, the heights H2 and H3 may be about equal. For example, in at least some example embodiments, the heights H2 and H3 may each be about 0.5 mm, resulting in a balanced via distribution. In these example embodiments, the distance D1 between the traces on the top and bottom surfaces 616 and 618 of the external portion 604 is about 1 mm.

The balanced via distribution employed in the example multichannel RF feedthrough 600 may result in homogeneous RF performance between the Channels 2 and 3 on the top surface 616 and the Channels 1 and 4 on the bottom surface 618 of the external portion 604. By reducing the performance gap among top and bottom channels in the example multichannel RF feedthrough 600, the example multichannel RF feedthrough 600 may provide homogeneous multichannel interconnections for higher data rate applications.

Figure 9:
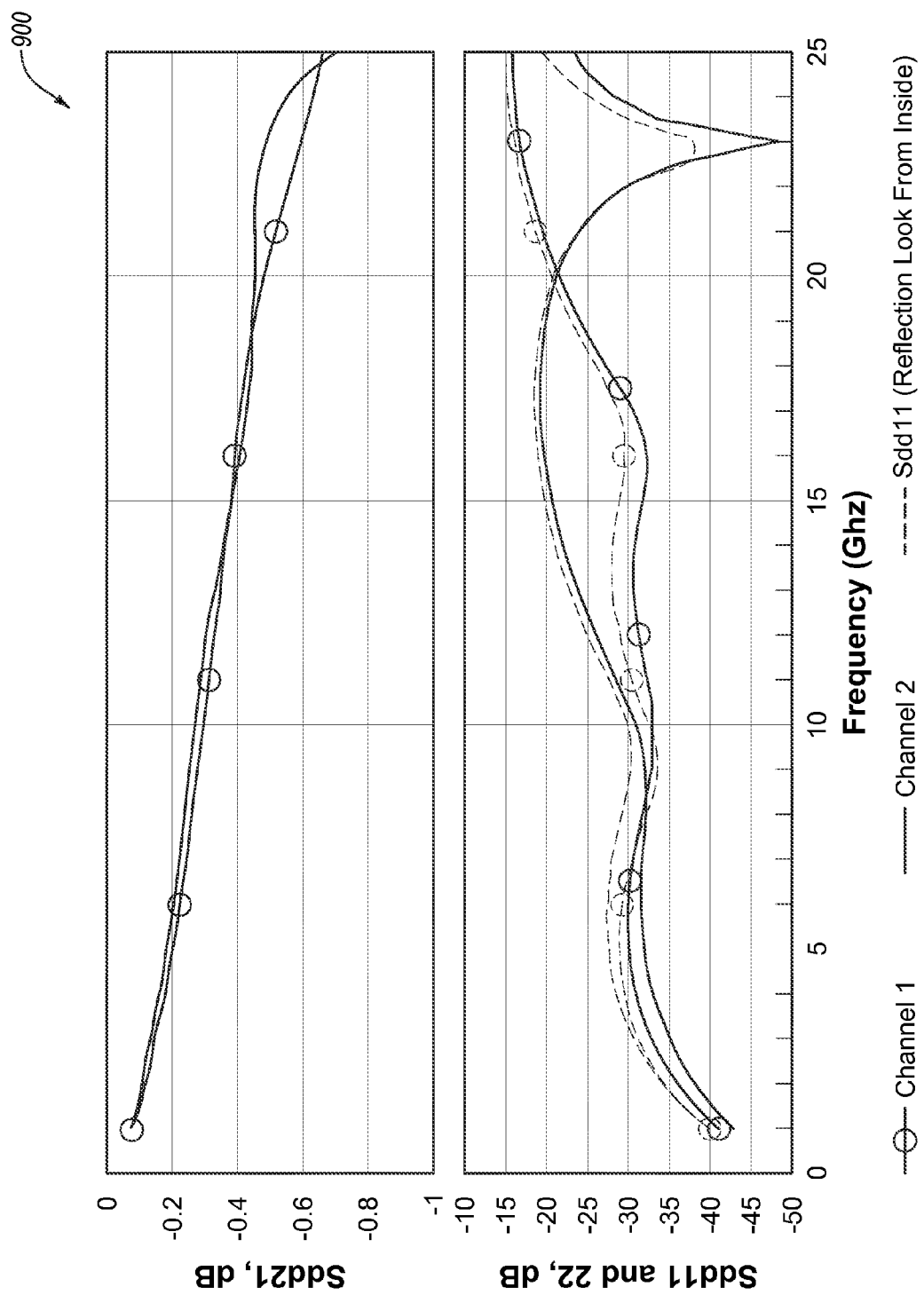
FIG. 9 is a chart showing various simulated performance characteristics of the example multichannel RF feedthrough of FIG. 6A.

FIG. 9 is a chart 900 showing various simulated performance characteristics of the example multichannel RF feedthrough 600. As disclosed in the chart 900 of simulated performance of FIG. 9, electronic data signals traveling along the non-coplanar paths of Channel 1 and Channel 2 of the example multichannel RF feedthrough 600 perform well at higher frequencies. In particular, the simulated performance disclosed in FIG. 9 illustrates that the example multichannel RF feedthrough 600 extends the data rate from 40 Gbps (4×10 Gbps) to 100 Gbps (4×25 Gbps). FIG. 9 shows the comparison of transmission and reflection of Channel 1 and Channel 2. The reflection level of Channel 1 is improved by about 5 to about 10 dB and satisfies a −15 dB requirement across the 25 GHz bandwidth. Between these channels, the RF performance in the example multichannel RF feedthrough 600 is more homogeneous than the example multichannel RF feedthrough 200.

Although the example multichannel RF feedthroughs disclosed herein only include sets of traces having a ground-signal-signal-ground (GSSG) configuration, it is understood that other example multichannel RF feedthroughs may have sets of traces having other configurations such as ground-signal-ground (GSG) or ground-signal-ground-signal-ground (GSGSG). Further, although the example multichannel RF feedthroughs disclosed herein each include four electrical communication channels (Channels 1-4), it is understood that other example multichannel RF feedthroughs may include two or more electrical communication channels such as two, three, five, six, seven, eight, or more electrical communication channels. Where there is an even number of electrical communication channels in a multichannel RF feedthrough, half of the electrical communication channels may be formed on the top surface and half on the bottom surface of the external portion in order to minimize the width of the external portion. Where there are an odd number of electrical communication channels, the electrical communication channels may be divided between the top surface and the bottom surface of the external portion as evenly as possible in order to minimize the width of the external portion (e.g. where there are seven electrical communication channels, three may be formed on the top surface and four may be formed on the bottom surface, or vice-versa).

The example embodiments disclosed herein may be embodied in other specific forms. The example embodiments disclosed herein are therefore to be considered in all respects only as illustrative and not restrictive.

The invention claimed is:

1. An optoelectronic module comprising:
an optoelectronic module shell;
a printed circuit board at least partially positioned within the optoelectronic module shell;
an optical subassembly at least partially positioned within the optoelectronic module shell, the optical subassembly including:
an optical subassembly housing;
an optical transducer positioned within the optical subassembly housing;
an optical port defined in the optical subassembly housing through which optical data signals can pass between the optical transducer and an optical fiber; and
a multichannel RF feedthrough formed in the optical subassembly housing, the multichannel RF feedthrough including:
an internal portion located within the optical subassembly housing, the internal portion including a top surface on which first, second, third, and fourth sets of traces are formed, each set of traces configured as an electrical communication channel to carry electrical data signals between the optical transducer and the printed circuit board;
an external portion located outside the optical subassembly housing, the external portion including a top surface on which the second and third sets of traces are formed and a bottom surface on which the first and fourth sets of traces are formed; and
first and second sets of vias connecting the first and fourth sets of traces, respectively, between the top surface of the internal portion located within the optical subassembly housing and the bottom surface of the external portion located outside the optical subassembly housing;
a bottom flexible electrical interface connected to the printed circuit board and the first and fourth sets of traces at the bottom surface of the external portion of the multichannel RF feedthrough; and
a top flexible electrical interface connected to the printed circuit board and the second and third sets of traces at the top surface of the external portion of the multichannel RF feedthrough.

2. The optoelectronic module as recited in claim 1, wherein the top surface of the internal portion is coplanar with the top surface of the external portion.

3. The optoelectronic module as recited in claim 2, wherein the multichannel RF feedthrough further includes a ground shield positioned between the top and bottom surfaces of the external portion, the ground shield being electrically grounded to ground traces in the first, second, third, and fourth sets of traces.

4. The optoelectronic module as recited in claim 1, wherein the top surface of the internal portion is not coplanar with the top surface of the external portion, and the top surface of the internal portion is positioned about half-way between the top and bottom surfaces of the external portion.

5. The optoelectronic module as recited in claim 1, wherein the spacing between traces in the sets of traces is greater on the top and bottom surfaces of the external portion than on the top surface of the internal portion.

6. The optoelectronic module as recited in claim 1, wherein the printed circuit board includes an edge connector that extends outside the optoelectronic module shell.

7. The optoelectronic module as recited in claim 1, wherein the length of each via in the first and second sets of vias is about 0.5 mm.

8. The optoelectronic module as recited in claim 1, wherein the distance between the top and bottom surfaces of the external portion is about 1 mm.

9. The optoelectronic module as recited in claim 1, wherein the spacing between traces in the first, second, third, and fourth sets of traces is greater on the top and bottom surfaces of the external portion than on the top surface of the internal portion.

10. The optoelectronic module as recited in claim 1, wherein the optical transducer includes an optical transmitter.

11. The optoelectronic module as recited in claim 1, wherein the optical transducer includes an optical receiver.

12. An optoelectronic module comprising:
a shell;
a printed circuit board at least partially positioned within the shell, the printed circuit board including an edge connector that extends outside the shell;
a transmitter optical subassembly at least partially positioned within the shell, the transmitter optical subassembly including:
a transmitter optical subassembly housing;
an optical transmitter positioned within the transmitter optical subassembly housing;
an optical port defined in the transmitter optical subassembly housing through which optical data signals can pass from the optical transmitter to a first optical fiber; and
a first multichannel RF feedthrough formed in the transmitter optical subassembly housing, the first multichannel RF feedthrough including:
an internal portion located within the transmitter optical subassembly housing, the internal portion including a top surface on which first, second, third, and fourth sets of traces are formed, each of the first, second, third, and fourth set of traces electrically connected to the optical transmitter;

an external portion located outside the transmitter optical subassembly housing, the external portion including:
  a top surface on which the second and third sets of traces are formed; and
  a bottom surface on which the first and fourth sets of traces are formed; and first and second sets of vias connecting the first and fourth sets of traces, respectively, between the top surface of the internal portion and the bottom surface of the external portion;

a receiver optical subassembly at least partially positioned within the shell, the receiver optical subassembly including:
  a receiver optical subassembly housing;
  an optical receiver positioned within the receiver optical subassembly housing;
  an optical port defined in the receiver optical subassembly housing through which optical data signals can pass from a second optical fiber to the optical receiver; and
  a second multichannel RF feedthrough formed in the receiver optical subassembly housing, the second multichannel RF feedthrough including:
    an internal portion located within the receiver optical subassembly housing, the internal portion including a top surface on which fifth, sixth, seventh, and eighth sets of traces are formed, each of the fifth, sixth, seventh, and eighth set of traces electrically connected to the optical receiver;
    an external portion located outside the receiver optical subassembly housing, the external portion including:
      a top surface on which the sixth and seventh sets of traces are formed; and
      a bottom surface on which the fifth and eighth sets of traces are formed; and
    third and fourth sets of vias connecting the fifth and eighth sets of traces, respectively, between the top surface of the internal portion and the bottom surface of the external portion;

a first flexible electrical interface including:
  a first bottom flexible electrical interface connected to the printed circuit board and to the first and fourth sets of traces at the bottom surface of the external portion of the first multichannel RF feedthrough; and
  a first top flexible electrical interface connected to the printed circuit board and to the second and third sets of traces at the top surface of the external portion of the first multichannel RF feedthrough; and a second flexible electrical interface including:
  a second bottom flexible electrical interface connected to the printed circuit board and to the fifth and eighth sets of traces at the bottom surface of the external portion of the second multichannel RF feedthrough; and
  a second top flexible electrical interface connected to the printed circuit board and to the sixth and seventh sets of traces at the top surface of the external portion of the second multichannel RF feedthrough.

13. The optoelectronic module of claim 12, wherein:
the first bottom flexible electrical interface and the second bottom flexible electrical interface are connected to the printed circuit board at a bottom surface of the printed circuit board; and
the first top flexible electrical interface and the second top flexible electrical interface are connected to the printed circuit board at a top surface of the printed circuit board.

* * * * *